(12) United States Patent
Nagano et al.

(10) Patent No.: US 6,975,659 B2
(45) Date of Patent: Dec. 13, 2005

(54) LASER DIODE ARRAY, LASER DEVICE, WAVE-COUPLING LASER SOURCE, AND EXPOSURE DEVICE

(75) Inventors: Kazuhiko Nagano, Kaisei-machi (JP); Yoji Okazaki, Kaisei-machi (JP); Teruhiko Kuramachi, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/237,687

(22) Filed: Sep. 10, 2002

(65) Prior Publication Data

US 2003/0048819 A1 Mar. 13, 2003

(30) Foreign Application Priority Data

Sep. 10, 2001 (JP) .......................................... 2001-273870
Sep. 10, 2001 (JP) .......................................... 2001-273871
Jul. 10, 2002 (JP) .......................................... 2002-201979

(51) Int. Cl.[7] .............................. H01S 3/04; H01S 0/91
(52) U.S. Cl. ............................................. 372/36; 372/75
(58) Field of Search .............................. 372/34–36, 75, 372/50, 31, 101

(56) References Cited

U.S. PATENT DOCUMENTS

| | | | |
|---|---|---|---|
| 5,127,020 A | * | 6/1992 | Kurihara ..................... 375/151 |
| 5,139,609 A | | 8/1992 | Fields et al. ................. 456/643 |
| 5,185,758 A | | 2/1993 | Fan et al. ......................... 372/72 |
| 5,196,720 A | * | 3/1993 | Sugai et al. .................. 257/254 |
| 5,448,661 A | * | 9/1995 | Takai et al. .................... 385/24 |
| 5,500,540 A | * | 3/1996 | Jewell et al. .................. 257/82 |
| 5,500,869 A | * | 3/1996 | Yoshida et al. ................ 372/50 |
| 5,668,825 A | * | 9/1997 | Karpinski ..................... 372/101 |
| 5,675,685 A | * | 10/1997 | Fukuda et al. ................. 385/89 |
| 5,713,654 A | * | 2/1998 | Scifres ......................... 362/496 |
| 5,715,339 A | * | 2/1998 | Takai et al. .................... 385/24 |
| 5,761,234 A | * | 6/1998 | Craig et al. ................... 372/75 |
| 5,790,576 A | * | 8/1998 | Waarts et al. ................. 372/43 |
| 5,793,783 A | * | 8/1998 | Endriz .......................... 372/31 |
| 5,835,515 A | * | 11/1998 | Huang .......................... 372/36 |
| 6,240,116 B1 | * | 5/2001 | Lang et al. .................... 372/50 |
| 6,687,271 B2 | * | 2/2004 | Um et al. ...................... 372/36 |
| 6,724,792 B2 | * | 4/2004 | Rice ............................. 372/36 |
| 6,775,312 B2 | * | 8/2004 | Wiedmann et al. ........... 372/50 |
| 2002/0183002 A1 | * | 12/2002 | Vail et al. ...................... 455/10 |

OTHER PUBLICATIONS

Japanese Journal of Applied Physics, vol. 37, 1998, pp. L1020–1022, no month.

* cited by examiner

Primary Examiner—Hoang V. Nguyen
Assistant Examiner—Hung Tran Vy
(74) Attorney, Agent, or Firm—Sughrue Mion, PLLC

(57) ABSTRACT

A plurality of multi-cavity laser diode chips, each having a plurality of light emitting points, are fixed side by side and form a laser diode array.

35 Claims, 30 Drawing Sheets

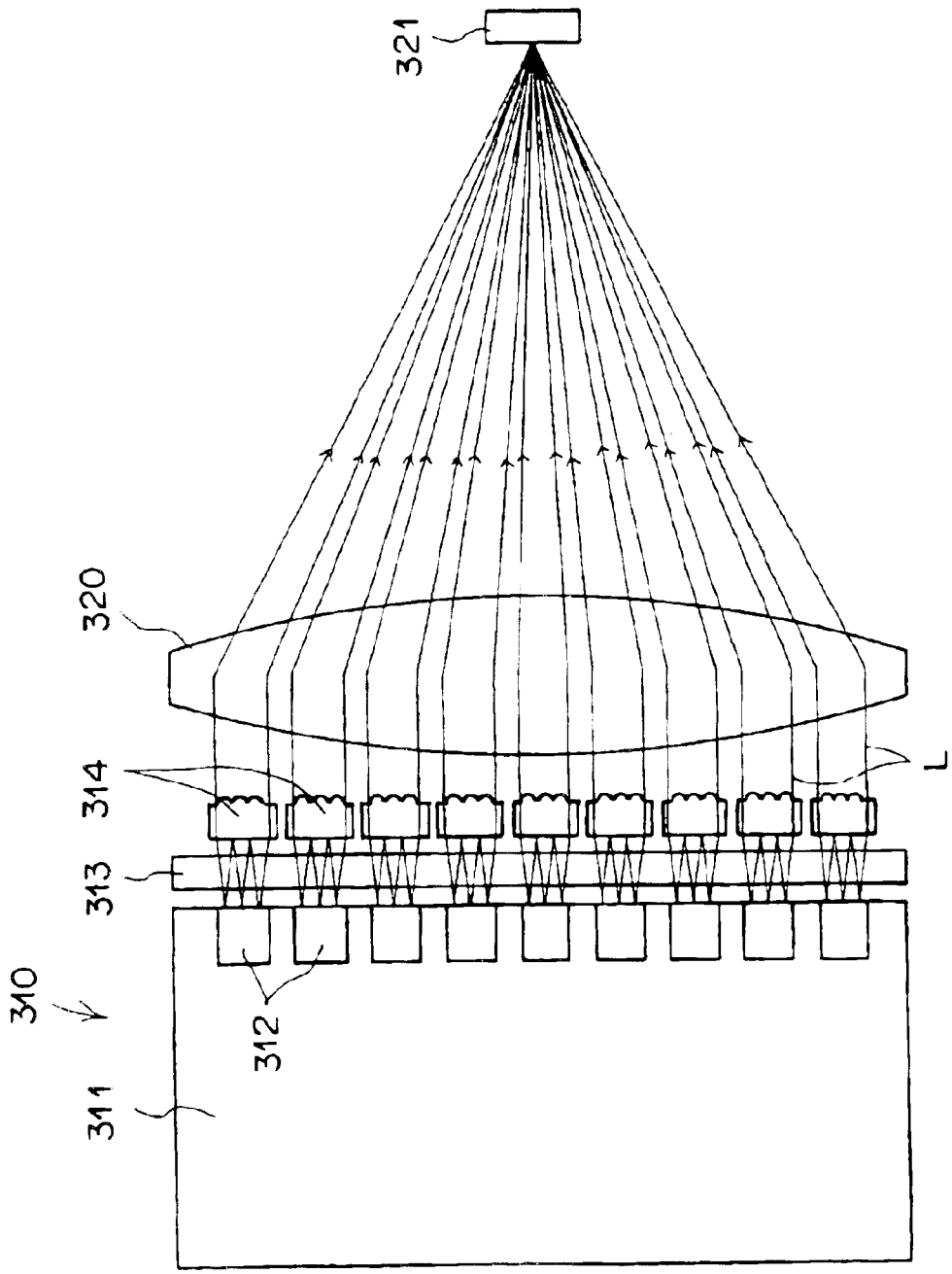

LASER DIODE ARRAY, LASER DEVICE, WAVE-COUPLING LASER SOURCE, AND EXPOSURE DEVICE

BACKGROUND OF THE INVENTION

1. Field of the Invention

This invention relates to a laser diode array, and more particularly to a laser diode array comprising a plurality of multi-cavity laser diode chips, each having a plurality of light emitting points, fixed side by side.

This invention further relates to a laser device, a wave-coupling laser source and an exposure device using such a laser diode array.

2. Description of the Related Art

As devices for generating a laser beam in an ultraviolet region, there have been put into practice, for instance, a wavelength conversion laser in which infrared light generated from a semiconductor-laser-pumped solid state laser is converted to its third harmonic in an ultraviolet region, an excimer laser, and an Ar-laser.

Further, GaN-semiconductor lasers radiating a laser beam substantially at 400 nm have been recently provided as shown in "Jpn. Appl. phys. Lett.", Vol. 37, p. L1020.

A light source radiating a laser beam whose wavelength is in such a wavelength range is useful as an exposure light source for exposing a photosensitive material having a sensitivity to a certain wavelength in an ultraviolet region (a wavelength region including 350 to 420 nm). Needless to say, such an exposure light source should have an output power sufficient to cause the photosensitive material to react.

In order to use as the exposure light source, the excimer laser is too large in size, which increases the manufacturing cost and the maintenance cost.

The wavelength conversion laser in which infrared light is converted to its third harmonic is very difficult to obtain high output power due to its very poor wavelength-conversion efficiency. At present it is practical to pump a solid laser medium by a semiconductor laser of 30 W to cause a fundamental wave (1064 nm in wavelength) of 10 W to oscillate and to convert the fundamental wave to its second harmonic (532 nm in wavelength), thereby obtaining a third harmonic (355 nm in wavelength) of 1 W as the sum frequency of the fundamental wave and its second harmonic. The power-light conversion efficiency of the semiconductor laser is only 50% in this case, and the conversion efficiency to ultraviolet light is as low as about 1.7%. Further, use of an expensive wavelength conversion element adds to the cost of such a wavelength conversion laser.

Further, use of the Ar-laser encounters a difficulty that the Ar-laser is as low as 0.005% in power-light conversion efficiency and is as short as about 1000 hours in service life.

In the GaN-semiconductor laser, since a low-transition GaN-crystal substrate cannot be obtained, there have been made attempts of obtaining high output power and high reliability by making a low-transition region of about 5 $\mu$m by a method of growth called FLOG and forming a laser region thereon. However, even in a GaN-semiconductor laser thus obtained, those which are as high as 500 mW to 1 W have not been commercially available because of the difficulties in making a low-transition substrate in a large area.

Another attempt of obtaining a high output power semiconductor laser involves obtaining 10 W output power by forming, for instance, 100 cavities each emitting light of 100 mW, and coupling the outputs of the cavities. However, to form cavities of as many as 100 at high yield is hardly practical. Especially, it is difficult to make a GaN-semiconductor laser at a yield higher than 99% even if it is of a single cavity.

SUMMARY OF THE INVENTION

In view of the foregoing observations and description, the primary object of the present invention is to provide a laser diode array which is very high in output power.

Another object of the present invention is to provide a laser device and a wave-coupling laser source which is very high in output power.

Still another object of the present invention is to provide an exposure device which can expose a photosensitive material to a laser beam of a high intensity.

In accordance with a first aspect of the present invention, there is provided a laser diode array comprising a plurality of multi-cavity laser diode chips, each having a plurality of light emitting points, fixed side by side.

It is preferred that the multi-cavity laser diode chips be arranged in the direction in which the light emitting points in each of the multi-cavity laser diode chips are arranged. The number of cavities in each of the multi-cavity laser diode chips is preferably 2 to 10, and more preferably 2 to 6.

It is further preferred that each of the multi-cavity laser diode chips be not larger than 3 mm in its width, that is, the size in the direction of arrangement of its light emitting points, and the multi-cavity laser diode chips be fixed on a fixing block in a junction-down structure with fluctuation in height of the light emitting position held not larger than 5 $\mu$m. In the case of fiber wave-coupling (coupling laser beams by an optical fiber), the laser beams can be coupled at a high efficiency in an optical fiber not larger than 50 $\mu$m in core diameter by fixing the multi-cavity laser diode chips in a junction-down structure with fluctuation in height of the light emitting position held not larger than 2 $\mu$m.

The "junction-down structure" is a structure where the multi-cavity laser diode chips are fixed to a heat radiating mount not at their substrate side but at their side on which the element is formed (the pn-junction side).

It is preferred that the multi-cavity laser diode chips be a nitride-series semiconductor, the multi-cavity laser diode chips be mounted on a heat radiating block of Cu or Cu-alloy by way of a sub-mount, the sub-mount be formed of a material whose coefficient of thermal expansion is $3.5\sim6.0\times10^{-6}/°$ C. and be 200 to 400 $\mu$m thick, and the multi-cavity laser diode chips be bonded to the sub-mount in a junction-down structure by way of an AuSn-eutectic solder layer and a metallized layer which are divided into a plurality of portions in the bonding plane between the multi-cavity laser diode chip and the sub-mount.

In this case, it is further preferred that the sub-mount be of AlN.

Further, it is preferred that the sub-mount be bonded to the heat radiating block of Cu or Cu-alloy by AuSn-eutectic solder.

In accordance with a second aspect of the present invention, there is provided a laser device comprising a block on which the multi-cavity laser diode chips of a laser diode array in accordance with the first aspect of the present invention are fixed and a collimator lens array consisting of a plurality of collimator lens elements integrated with each other to be arranged in one direction, each of the collimator lens elements being for converting a laser beam emitted from the corresponding one of the plurality of light emitting points of the multi-cavity laser diode chips to a parallel light beam, wherein a flat lens locator surface which is perpendicular to the axes of light emission of the multi-cavity laser diode chips is formed on the block at a predetermined distance from the light emitting points of the multi-cavity laser diode chips forward of the multi-cavity laser diode chips fixed to the block, and the collimator lens array is fixed to the block with an end face of the collimator lens array in abutment against the lens locator surface.

It is preferred that the lens locator surface be not larger than 0.5 µm in flatness. It is further preferred that the surface of the block on which the multi-cavity laser diode chips are fixed be not larger than 0.5 µm in flatness. It is preferred that a reference mark on the basis of which the multi-cavity laser diode chips are fixed on the block is put on the upper surface or side surface of the block.

In the laser device in accordance with the second aspect of the present invention, it is further preferred that the multi-cavity laser diode chips be arranged in a plurality of rows arranged in a direction intersecting the direction in which the light emitting points in each multi-cavity laser diode chip are arranged with the light emitting points in the multi-cavity laser diode chips in each row being arranged in one direction, and a plurality of collimator lens arrays be arranged in a direction intersecting the direction in which the collimator lens elements in each collimator lens array are arranged. It is further preferred that the multi-cavity laser diode chips be arranged in a row discretely from each other with the light emitting points in each multi-cavity laser diode chip arranged in one direction, and the collimator lens array be positioned so that the optical axis of each collimator lens element is aligned with one of the light emitting points.

In accordance with a third aspect of the present invention, there is provided a wave-coupling laser source comprising a laser diode array in accordance with the first aspect of the present invention, a multimode optical fiber, and a condenser optical system which condenses a plurality of laser beams emitted from the laser diode array and couples together the laser beams in the multimode optical fiber.

In the wave-coupling laser source in accordance with the third aspect of the present invention, it is preferred that the multi-cavity laser diode chips be arranged so that the light emitting points are arranged in a row in a direction parallel to the active layer of each laser diode chip, and the condenser optical system comprises a plurality of collimator lenses which are provided for each of the laser diode chips and each of which is smaller in diameter of aperture in the direction in which the light emitting points are arranged than that in a direction perpendicular to the direction, and a condenser lens which condenses a plurality of laser beams each collimated by the respective collimator lenses and converges the laser beams on an end face of the multimode optical fiber.

Further it is preferred that the collimator lenses are integrated into a lens array.

Further, it is preferred that the condenser optical system comprises a plurality of collimator lens portions each collimating a plurality of laser beams emitted from the laser diode array and a condenser lens portion which converges the laser beams collimated by the collimator lens portions on a point and is integrated with the collimator lens portions.

Further it preferred that the multi-cavity laser diode chip is a GaN-laser diode chip.

Further it preferred that the plurality of multi-cavity laser diode chips are two-dimensionally arranged as seen from the side which is irradiated by the laser beam.

Further it is preferred that the plurality of multimode optical fibers be arranged to form a one-dimensional array at least at their light exit ends, and said laser diode array and the condenser optical system be combined with each of the multimode optical fibers, or a plurality of multimode optical fibers be arranged like a bundle at least at their light exit ends, and said laser diode array and the condenser optical system be combined with each of the multimode optical fibers.

In accordance with a fourth aspect of the present invention, there is provided a wave-coupling laser source comprising a multimode optical fiber, a multi-cavity laser diode chip having a plurality of light emitting points arranged in a width substantially equal to the diameter of the core of the multimode optical fiber, and an optical system which couples laser beams emitted from the respective light emitting points of the multi-cavity laser diode chip together in the multimode optical fiber.

In accordance with a fifth aspect of the present invention, there is provided an exposure device characterized by having a wave-coupling laser source in accordance with the third or fourth aspect of the present invention where a plurality of multimode optical fibers be arranged to form a one-dimensional array at least at their light exit ends or to form a bundle at least at their light exit ends.

In the laser diode array of the present invention, since a plurality of multi-cavity laser diode chips, each of which is of high output power, are provided, especially high output power can be obtained.

When the multi-cavity laser diode chips are arranged in the direction in which the light emitting points in each of the multi-cavity laser diode chips are arranged, number of light emitting points are arranged in a row. Accordingly, a line lighting source which can emit a plurality of high-intensity laser beams arranged in a line and accordingly is useful in various fields can be obtained.

Assuming that yield on production of one cavity is 98% as is generally the case, yield on a multi-cavity laser diode chip having 10 non-defective cavities is 82%, which is a limit in practically producing laser diode arrays at sufficiently low cost. Accordingly, it is preferred that the number of cavities per one multi-cavity laser diode chip be not larger than 10 (of course not smaller than 2).

Further, in view of the heat radiating characteristics of the chip, when the multi-cavity laser diode chip has 10 cavities, each being of output power of 100 mW, heat of about 7 W must be radiated. When the amount of heat to be radiated becomes larger than 7 W, warping of the chip due to heat generation can occur and it becomes difficult for the laser beams generated from the laser diode array to be uniform in amount of light. Further, when the amount of heat to be radiated increases, reliability of the laser diode array deteriorates due to influence of strain and/or heat.

The reason why the number of the cavities per one laser diode chip is more preferably 2 to 6 is as follows. That is, when the number of the cavities per one laser diode chip is 2, the output power can be twice that of the single cavity laser diode chip and yield on production of the multi-cavity laser diode chips is as high as 96% assuming that yield on production of one cavity is 98%. When the number of the cavities per one laser diode chip is 6, the output power can be six times that of the single cavity laser diode chip and yield on production of the multi-cavity laser diode chips is as high as 89%. Further, when the number of cavities is in the range of 2 to 6, the amount of heat to be radiated is about 1 to 4 W (assuming that the output power per one cavity is 100 mW), which can be sufficiently radiated, whereby warping of the chip due to heat generation can be suppressed and high output power and high reliability can be realized.

Further, when each of multi-cavity laser diode chips in the laser diode array of the present invention is not larger than 3 mm in width, the following effect can be obtained. That is, the GaN-laser diode, which is suitable for producing a laser diode array of the present invention, is produced by crystal growth at a high temperature (1000 to 1200° C.), is sapphire in substrate material, and includes InGaN which is apt to generate strain during crystal growth. Accordingly, when the GaN-laser diode chip is relatively large in width, a large fluctuation of light emitting position height can be generated due to the strain when the diode chip is mounted on a heat block. Especially when a plurality of multi-cavity laser diode chips are arranged in a row to form a light source which emits laser beams arranged in a line or when the laser beams are coupled together in an optical fiber at a high coupling efficiency, the laser beams emitted from the respective chips fail to be arranged in a line when a large fluctuation of light emitting position height is generated, which is fatal to such purposes. When the chip width is not larger than 3 mm, the fluctuation of light emitting position height can be suppressed to such an extent that involve practically no problem.

The relation between the chip width and the fluctuation of light emitting position height will be described in more detail. In the past, in order to produce a high output laser diode which is as high as 10 W in output power and small in strain of the substrate, bar-type laser diodes 10 mm wide have been mounted in a junction-down structure. However, in this case, fluctuation in light emitting position height not smaller than 10 $\mu$m has been generated due to, for instance, warping of the substrate. Specifically, in the case of a GaN-laser diode, fluctuation is about 20 $\mu$m for a chip width of 10 mm and about 4 $\mu$m for a chip width of 5 mm. When the chip width is not larger than 3 mm, influence of warping of the substrate can be suppressed to not larger than 1/10 for a chip of 10 mm in length, and warping of the substrate can be not larger than 1 $\mu$m, which results in fluctuation in light emitting position height not larger than 5 $\mu$m, which involves practically no problem, even if fluctuation in height of the chips is added. Further, when laser beams emitted from the respective multi-cavity laser diode chips are coupled together in an optical fiber, fluctuation in positions in which the respective laser beams are converged by a magnifying optical system of 5 to 10× can be suppressed to 10 to 20 $\mu$m by suppressing fluctuation in light emitting position height to not larger than 2 $\mu$m, whereby high efficiency fiber coupling becomes feasible.

When the multi-cavity laser diode chip is of a nitride-series semiconductor, the multi-cavity laser diode chip is mounted on a heat radiating block of Cu or Cu-alloy by way of a sub-mount, the sub-mount is formed of a material which is 3.5~6.0×10$^{-6}$/° C. in coefficient of thermal expansion and is 200 to 400 $\mu$m thick, and the multi-cavity laser diode chip is bonded to the sub-mount in a junction-down structure by way of an AuSn-eutectic solder layer and a metallized layer which are divided into a plurality of portions in the bonding plane between the multi-cavity laser diode chip and the sub-mount, heat generated by the laser diode chips can be well radiated and the laser diode array can be produced at low cost since the heat radiating block of Cu or Cu alloy is inexpensive and high in thermal conductivity. Further since the laser diode chip is fixed to the sub-mount in a junction-down structure, the light emitting portion is nearer to the sub-mount and accordingly to the heat radiating block as compared when the substrate side of the laser diode chips is fixed to the sub-mount, whereby heat can be better radiated.

Since the sub-mount is excellent in characteristics of position change with time, fluctuation with time of the position of the light emitting points of the laser diode chip can be effectively suppressed by bonding the chip to the sub-mount by the AuSn-eutectic solder.

When the sub-mount is formed of a material whose coefficient of thermal expansion is 3.5~6.0×10$^{-6}$/° C. and is 200 to 400 $\mu$m thick, deterioration of the laser diode chip due to thermal strain during soldering can be prevented, the reason for which will be described in detail later in conjunction with the preferred embodiments of the present invention.

When the AuSn-eutectic solder is divided into a plurality of parts in the bonding plane between the multi-cavity laser diode chip and the sub-mount, strain generated in this part can be suppressed and positional accuracy of the light emitting points in the direction of height can be improved.

In the laser device of this invention, a flat lens locator surface which is perpendicular to the axes of light emission of the multi-cavity laser diode chips is formed on the block at a predetermined distance from the light emitting points of the multi-cavity laser diode chips forward of the multi-cavity laser diode chips fixed to the block, and the collimator lens array is fixed to the block with an end face of the collimator lens array in abutment against the lens locator surface, the collimator lenses can be easily and precisely located with respect to the laser diode chips so that the optical axis of each collimator lens is aligned with the light emitting axis of the corresponding light emitting point.

When the collimator lens array is fixed to the block with the position relative to the block kept as it is located with respect to the block in the manner described above, the end face of the collimator lens array can be surely located at the predetermined distance from the light emitting point of the chip. By setting the predetermined distance as such a distance that brings a focal point of the collimator lens to the light emitting point of the chip, the collimator lens can be surely positioned in a proper position, that is, a position where it can surely collimate the divergent laser beam.

The collimator lens array may be fixed to the block by fixing said end face of the collimator lens array to the lens locator surface of the block or by fixing a surface of the collimator lens array other than said end face, e.g., a surface parallel to the optical axes of the collimator lenses to a surface of the block parallel to the light emitting axis of the laser diode chip.

When the lens locator surface is not larger than 0.5 $\mu$m in flatness, movement of the collimator lens array can be suppressed when the collimator lens array is fixed to the block, which makes it feasible to accurately locate the collimator lens array.

Further, when the surface on which the laser diode chips are fixed is not larger than 0.5 $\mu$m in flatness, movement of the collimator lens array can be suppressed when the collimator lens array is fixed to the block by a brazing material, which makes it feasible to accurately fix the collimator lens array. When a reference mark on the basis of which the multi-cavity laser diode chips are fixed on the block is put on the upper surface or side surface of the block, the laser diode array can be highly accurately mounted on the block.

When the multi-cavity laser diode chips two-dimensionally are arranged, that is, are arranged in a plurality of rows arranged in a direction intersecting the direction in which the light emitting points in each multi-cavity laser diode chip are arranged with the light emitting points in the multi-cavity laser diode chips in each row being arranged in one direction, and a plurality of collimator lens arrays are arranged in a direction intersecting the direction in which the collimator lens elements in each collimator lens array are arranged, a larger number of laser diode chips can be provided at a high density, whereby a wave-coupling laser beam of an especially high output power can be obtained.

Further, when the multi-cavity laser diode chips are arranged in a row discretely from each other, warping of chips can be suppressed and positional accuracy of light emitting points in the direction height can be improved.

Since being of a very simple structure in which laser beams emitted from a plurality of multi-cavity laser diode chips are condensed and introduced into a multimode optical fiber, the wave-coupling laser source of the present invention can be easily produced at low cost.

In the wave-coupling laser source in accordance with the third aspect of the present invention, when the multi-cavity laser diode chips are arranged so that the light emitting points are arranged in a row in a direction parallel to the active layer of each laser diode chip, and the condenser optical system comprises a plurality of collimator lenses which are provided for each of the laser diode chips and each of which is smaller in diameter of aperture in the direction in which the light emitting points are arranged than that in a direction perpendicular to the direction, and a condenser lens which condenses a plurality of laser beams each collimated by the respective collimator lenses and converges the laser beams on an end face of the multimode optical fiber, the multi-cavity laser diode chips can be disposed at shorter pitches and at higher density. When the multi-cavity laser diode chips are arranged at a high density, shift of the laser beams on the end face of the optical fiber becomes small and accordingly, positional precision required in assembly of the multi-cavity laser diode chips, the condenser optical system and the multimode optical fiber may be relatively loose. That positional precision required in assembly of the multi-cavity laser diode chips, the condenser optical system and the multimode optical fiber may be relatively loose together with the fact that the wave-coupling optical system is generally 5 to 10× in magnification and the fact that fluctuation in positions in which the laser beams are converged can be within 1 μm by providing a necessary number of light emitting points by a plurality of discrete multi-cavity laser diode chips allows a larger number of laser beams to be coupled and to realize high-efficiency coupling, whereby a higher output power laser source can be obtained. The reason will be described later in conjunction with the preferred embodiments of the present invention.

When a collimator lens array where a plurality of collimator lenses are integrated is used, the ineffective area formed around each lens can be smaller as compared with when a plurality of collimator lenses are separate from each other, which permits the collimator lenses to be disposed more closely. Since this permits the multi-cavity laser diode chips to be disposed at higher density, the effect that the positional precision may be relatively loose and the effect that a larger number of laser beams can be coupled and a higher output power laser source can be obtained are enhanced.

Further, in this case, since adjustment of all the collimator lenses can be done by adjustment of one collimator lens array, adjustment of the collimator lenses is simplified. When a reference mark is put on the upper surface or side surface of the LD block near to the light emitting point, especially in a position on a forward extension of the optical axis of the laser beam emitted from the light emitting point, the multi-cavity laser diode chip can be positioned at a high accuracy of ±0.1 to 0.3 μm with respect to the optical axis of the collimator lens array since the mark is not moved in a horizontal direction perpendicular to the optical axis due to thermal expansion of the LD block during mounting of the laser diodes, whereby laser beams can be accurately converged on a predetermined point and a high fiber coupling efficiency can be realized.

The effects described above is significant when the condenser optical system comprises a plurality of collimator lens portions which collimate a plurality of laser beams emitted from the laser diode array and a condenser lens portion which converges the collimated laser beams on a common point and is integrated with the collimator lens portions.

Further, in the fields of printing and medical images or in the case where an image formed by a print circuit board, a plasma display, liquid crystal display or the like is recorded on a photosensitive material by exposure, a fine image can be obtained when the multimode optical fiber is not larger than 50 μm in core diameter. Further, when the multimode optical fiber is not larger than 0.3 in numerical aperture NA, a sufficient focal depth can be ensured and a sharp image can be obtained.

When the wave-coupling laser source of the present invention has a plurality of multimode optical fibers arranged to form a one-dimensional array at least at their light exit ends, or a plurality of multimode optical fibers arranged like a bundle at least at their light exit ends, one- or two-dimensionally arranged high-intensity laser beams are emitted from the laser source. By modulating the one- or two-dimensionally arranged high-intensity laser beams by spatial optical modulators such as GLV or DMD which are one- or two-dimensionally arranged, the laser beams can be efficiently modulated for image exposure.

When the wave-coupling laser source of the present invention is used as a light source for image exposure, there is used a multimode optical fiber which is extremely small in diameter of the core (e.g., about 25 μm) as compared with an optical fiber employed in laser processing. In the case where such a thin multimode optical fiber is employed, it is difficult to introduce the whole laser beams emitted from light emitting points of the multi-cavity laser diode chip into the optical fiber by a condenser optical system if the light emitting points of the multi-cavity laser diode chip are distributed over a very large width as compared with the diameter of the core of the optical fiber.

On the other hand, if the light emitting points of the multi-cavity laser diode chip are distributed over a very small width, thermal interference between the light emitting points occurs or heat dissipation becomes difficult due to elevated thermal density, which makes the system instable and/or makes it difficult to increase high the output power.

Accordingly, it is preferred that the multi-cavity laser diode chip has a plurality of light emitting points arranged in a width substantially equal to the diameter of the core of the multimode optical fiber.

When such a wave-coupling laser source is used as a light source in an exposure device, a two-dimensional image can be recorded on photosensitive material by moving the photosensitive material in a sub-scanning direction with respect to the laser beams.

BRIEF DESCRIPTION OF THE DRAWINGS

FIG. 4 is a plan view of the light source shown in FIG. 3, FIGS. 5A and 5B are a plan view and a side view, respectively, showing another example of a light source comprising the laser diode array of the first embodiment.

DESCRIPTION OF THE PREFERRED EMBODIMENTS

Figure 1:
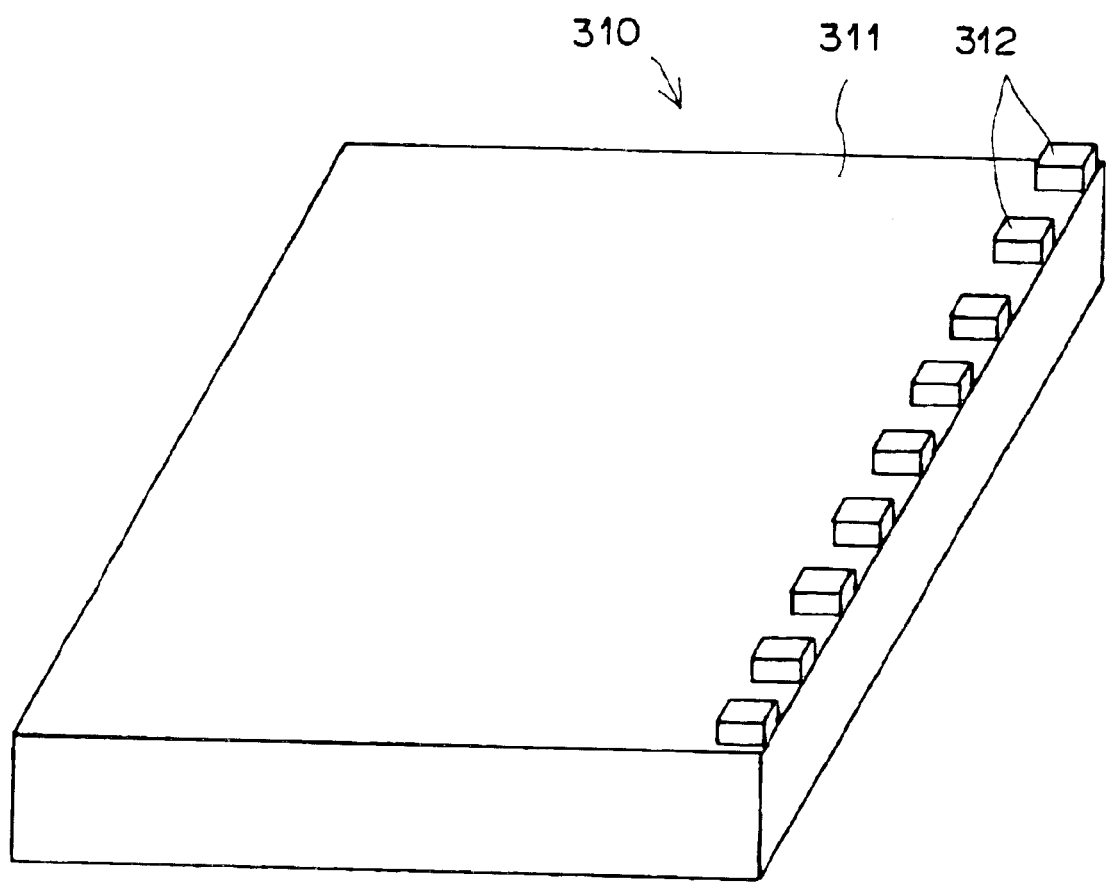
FIG. 1 is a perspective view showing a laser diode array in accordance with a first embodiment of the present invention.

As shown in FIG. 1, a laser diode array 310 comprises a heat block 311 of copper, and a plurality of multi-cavity laser diode chips 312 fixed on the heat block 311 at regular intervals. In this particular embodiment, each of the multi-cavity laser diode chips 312 is a GaN-laser diode oscillating at 405 nm.

Figure 2:
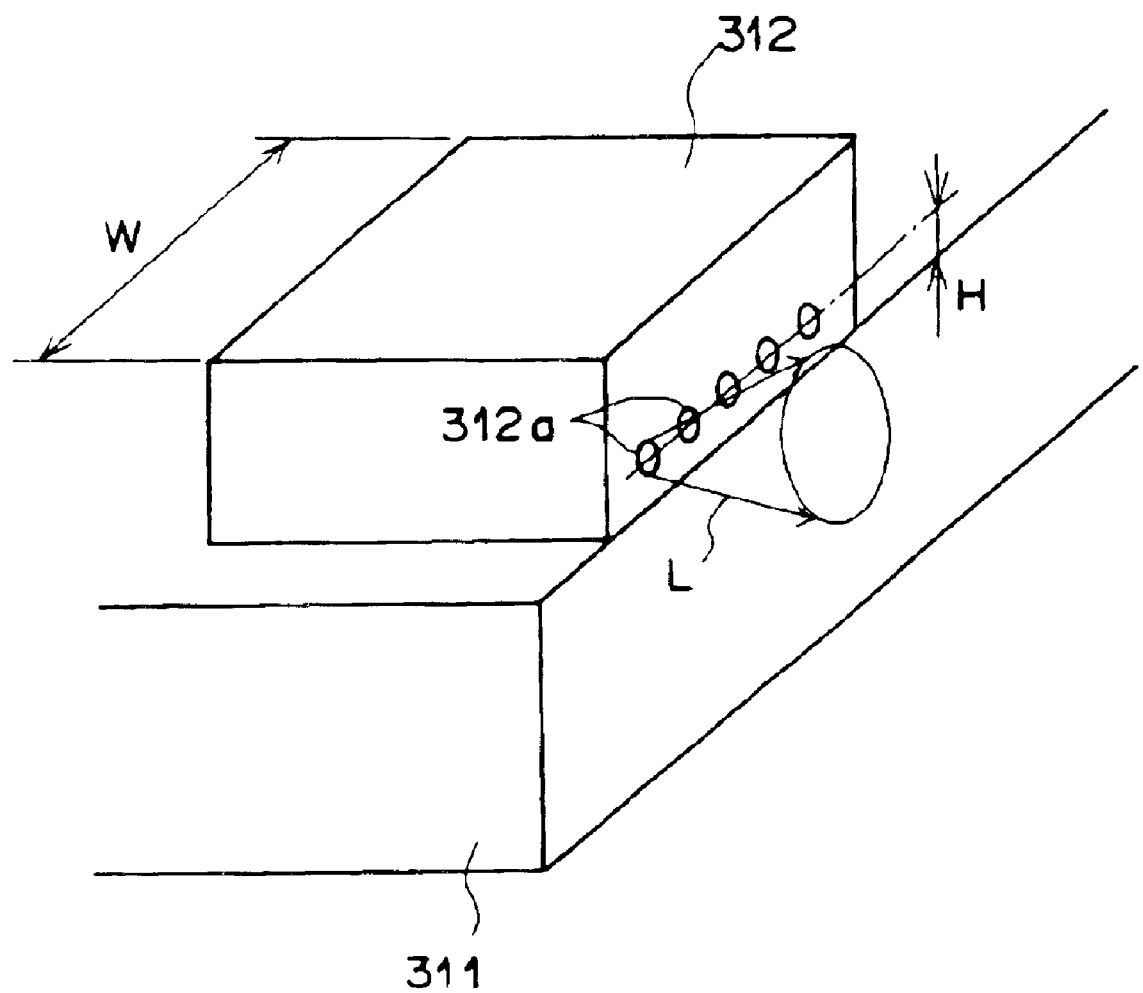
FIG. 2 is a perspective view showing the multi-cavity laser diode chip employed in the laser diode array.

As shown in FIG. 2, the multi-cavity laser diode chip 312 has a plurality of (five in this particular embodiment) cavities or light emitting points 312a, and the multi-cavity laser diode chips 312 are arranged on the heat block 311 in the direction in which the light emitting points 312a in each of the multi-cavity laser diode chips 312 are arranged.

In this particular embodiment, each cavity emits light at 100 mW from a portion 2 $\mu$m wide and five cavities are arranged at regular intervals of 80 $\mu$m. Accordingly, each multi-cavity laser diode chip is a chip whose total output power is 500 mW and which is 400 $\mu$m in width. In this case, since the multi-cavity laser diode chip is 500 mW in output power, the amount of heat to be dissipated from each chip is 3 W. Accordingly, even if each chip is 400 $\mu$m wide, heat generated in the chips can be dissipated without heat interference between the chips.

Further, each chip is 400 $\mu$m wide, even the GaN-laser diode which is large in strain can be not larger than 1 $\mu$m in warping. Even when 40 multi-cavity laser diodes are fixed to the heat block 311 in the manner shown in FIG. 1, it is possible to fix them so that fluctuation in height of the chips is within 1 $\mu$m and accordingly it is possible to fix them so that fluctuation in height of the 200 light emitting points (5×40) is within 2 $\mu$m in total.

To the contrast, when 200 cavities are formed at intervals of 80 $\mu$m, the width of the chip becomes as large as 16 mm and accordingly, in the case of the GaN-laser diode which is more apt to warp as compared with conventional infrared laser diodes, warping can be as large as 40 $\mu$m only in the chip itself, which results in fluctuation in height of the light emitting portions not smaller than 40 $\mu$m. Further, production of laser diode chips having as many as 200 cavities is very low in yield and is practically impossible. If not impossible to produce, fluctuation in height of the light emitting points makes it infeasible to use such a chip as a lighting source for a line spatial optical modulator such as a GLV which is about 25 $\mu$m in pixel size.

Similarly, when the cavities in each chip is 6 in number, each chip is 480 $\mu$m wide and warping of the substrate can be limited to 1 μm. Even if fluctuation in height of the chips is 1 μm, fluctuation in height of the light emitting points can be 2 μm at most in the laser diode array 310 of this embodiment. As a result, even if associated with a line spatial optical modulator such as a GLV which is about 25 μm in pixel size, fluctuation in height of the light emitting points can be about 10% of the pixel size at most in the case of the laser diode array 310 of this embodiment.

Though, in the embodiment shown in FIG. 1, the multi-cavity laser diode chips 312 are 9 in number, it is possible to provide more than 9 multi-cavity laser diode chips 312. For example, 40 multi-cavity laser diode chips 312 may be provided. Assuming that the output power of each multi-cavity laser diode chip 312 is 0.5 W and 40 chips are provided, the output power of the laser diode array 310 is 20 W in total. When three laser diode arrays 310 are used side by side, the total output power can be as high as 60 W.

The laser diode array 310 of this embodiment arranged in the manner described above can be suitably used as a light source which radiates a plurality of high-intensity laser beams arranged in a line. Such a light source will be described with reference to FIGS. 3 and 4 in addition to FIG. 1, hereinbelow.

Figure 3:
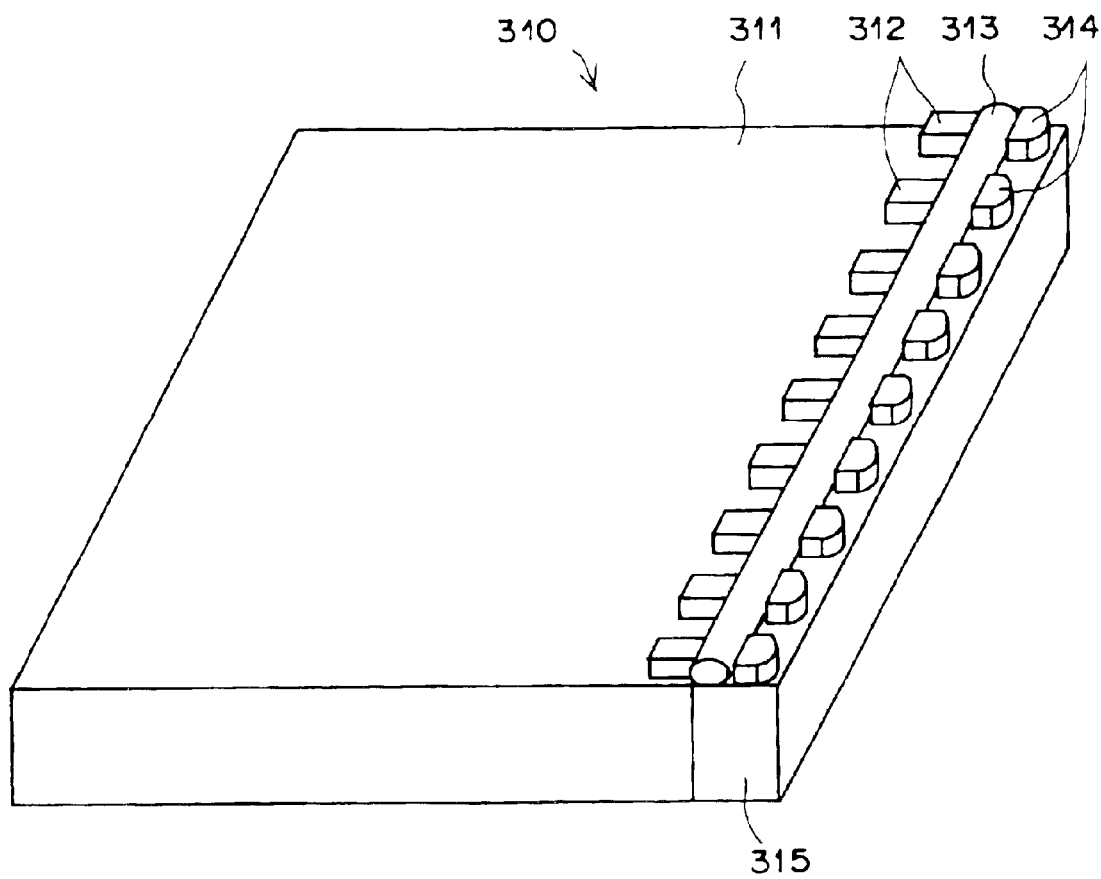
FIG. 3 is a perspective view showing an example of a light source comprising the laser diode array of the first embodiment.

As shown in FIG. 3, the light source comprises a laser diode array 310 consisting of a heat block 311 on which a plurality of multi-cavity laser diode chips 312 are fixed at regular intervals, a lens mount 315 in close contact with the heat block 311 (need not be in contact with the heat block 311 so long as it is positioned near the heat block 311), a plurality of lens arrays 314 fixed on the lens mount 315 each opposed to one multi-cavity laser diode chip 312, and a rod lens 313 disposed between the multi-cavity laser diode chips 312 and the lens arrays 314. Each lens array 314 may be convex or concave according to the purpose. Though not clearly shown in FIG. 3, each lens array 314 comprises a plurality of lens elements which are the same as the light emitting points in each of the multi-cavity laser diode chips 312 in number and are fixed in a row.

In FIG. 4, the lens mount 315 is abbreviated and only three of laser beams L radiated from each multi-cavity laser diode chip 312 are illustrated for the purpose of simplicity. As shown in FIG. 4, the laser beams L radiated from the multi-cavity laser diode chips 312 as divergent beams are converged by the rod lens 313 in the direction perpendicular to the surface of the paper of FIG. 4 and converged by the lens array 314 in the plane of the paper of FIG. 4 into parallel laser beams.

The parallel laser beams L thus formed are further converged by a condenser lens 320 on one modulator portion of a spatial modulator 321 comprising a plurality of linearly arranged modulator portions. As the spatial modulator 321, for instance, a line crystal liquid spatial modulator, a DMD (digital mirror device) or a GLV (grating light valve) may be used.

When a plurality of laser beams L are led to each of the modulator portions, the laser beams L led to each modulator portion can be modulated independently of the laser beams led to the other modulator portions.

Figure 5A:
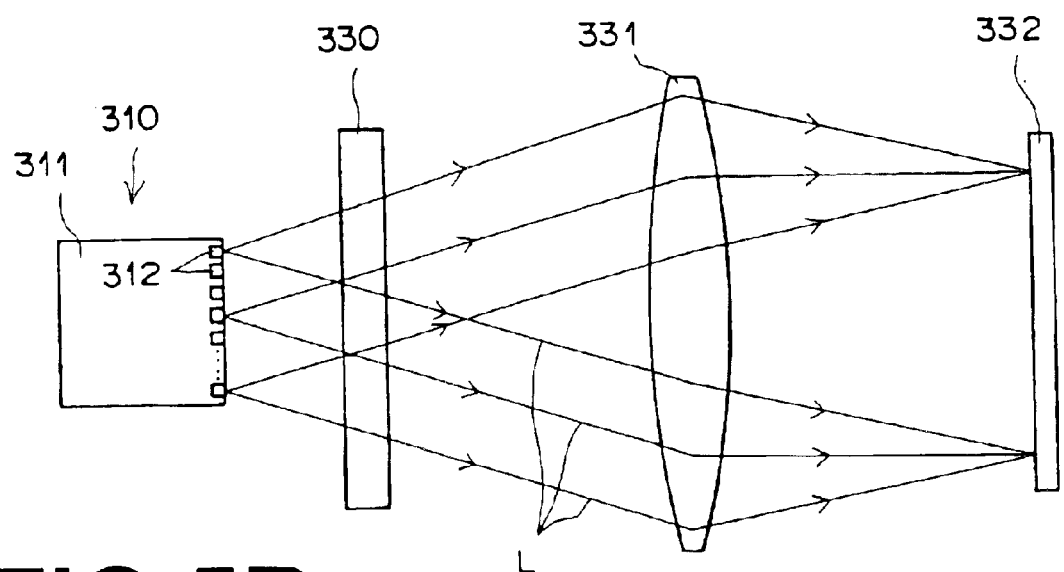
Figure 5B:
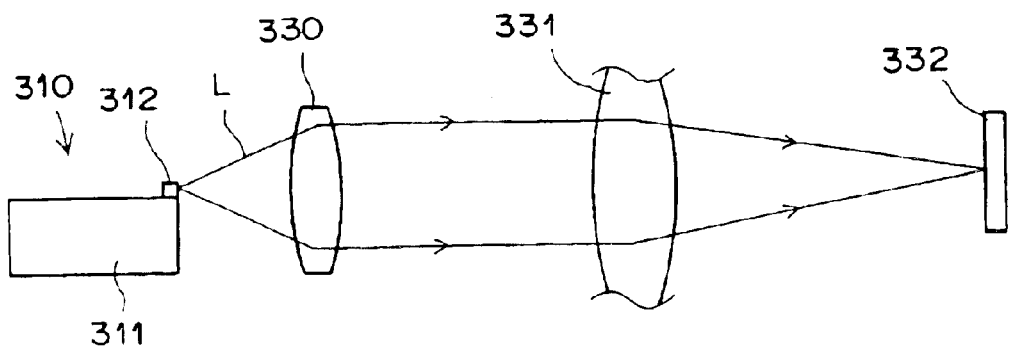

FIGS. 5A and 5B are a plan view and a side view, respectively, showing another example of the light source using the laser diode array 310 of this embodiment. In the example shown in FIGS. 5A and 5B, the laser beam L radiated from each of the multi-cavity laser diode chips 312 as a divergent beam is converged by a cylindrical lens 330 in a vertical surface shown in FIG. 5B into a parallel laser beam. Then the parallel laser beam L thus formed is further converged by a condenser lens 331 on one modulator portion of a spatial modulator 332 such as a GLV comprising a plurality of linearly arranged modulator portions.

When an optical system like an optical system of this example is employed, light of a uniform intensity can be projected onto the spatial modulator 332 irrespective of fluctuation in output power among the cavities of each multi-cavity laser diode chip 312 or among the multi-cavity laser diode chips 312. Further even when the output power of a certain cavity of the multi-cavity laser diode chips is nullified, the intensity of the light projected onto the spatial modulator 332 can be substantially uniform without substantially affected thereby.

In the laser diode array of the present invention, the number of the light emitting points in each multi-cavity laser diode chip or the number of the multi-cavity laser diode chips need not be limited to those described above but may be any number not smaller than 2 as desired.

Further, it is possible to employ any multi-cavity laser diode chips other than GaN-laser diodes in the laser diode array of the present invention.

Figure 6:
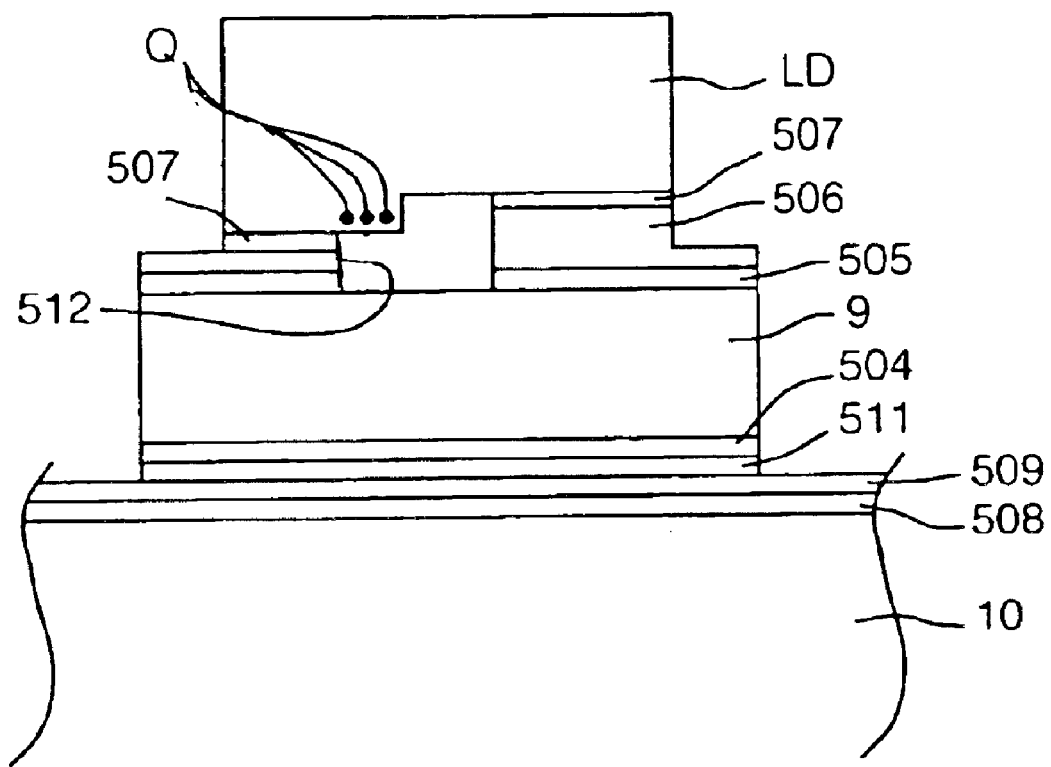
FIG. 6 is a front view showing a preferred structure of the laser diode array of the first embodiment.

A preferred structure of the laser diode array of the present invention will be described, hereinbelow. FIG. 6 shows a state where a GaN-multi-cavity laser diode chip (a nitride-series semiconductor laser diode chip) is mounted on a heat radiating block 10 of Cu. In this particular example, the GaN-multi-cavity laser diode chip has three light emitting points Q.

Figure 7:
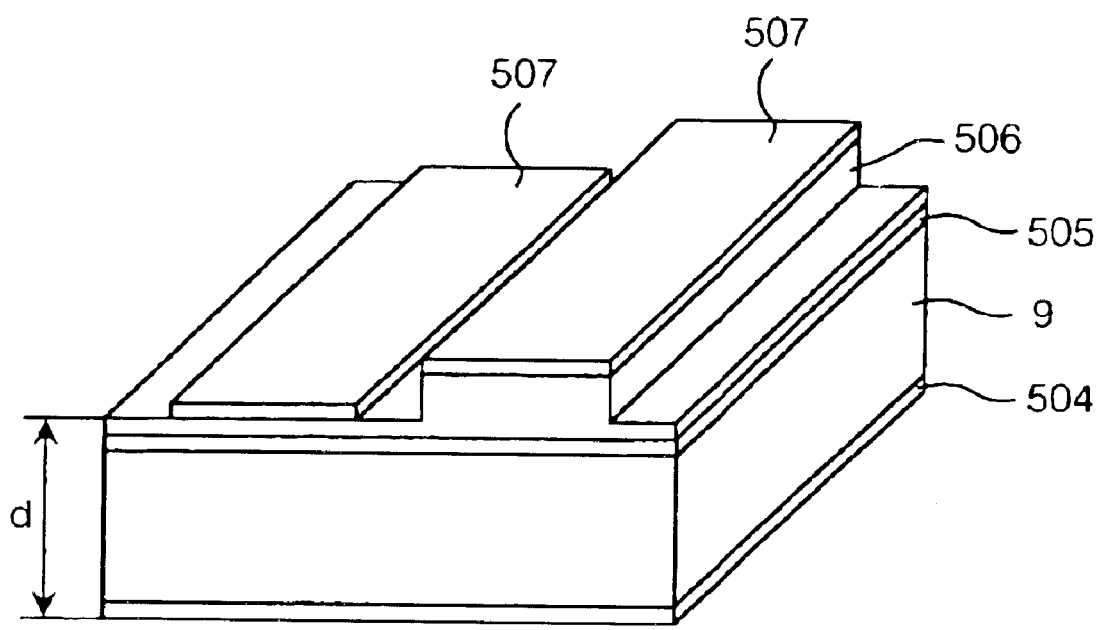
FIG. 7 is a perspective view showing a part of the structure shown in FIG. 6.

As shown in FIG. 7, a Au/Pt/Ti metallized layer 504 is formed on the lower side of a sub-mount 9 of AlN. A Au/Ni film 505 and a stepped Au/Pt/Ti metallized layer 506 are formed on the upper side of the AlN sub-mount 9. The thickness of the sub-mount 9 is as denoted by d shown in FIG. 7 and is exclusive of the thickness of the layers 504 to 506.

The stepped Au/Pt/Ti metallized layer can be formed, for instance, by forming a thick metallized layer of a uniform thickness and by removing a part of the thick metallized layer of a uniform thickness by a dry process such as ion-milling or a wet process, for instance, by the use of etchant or by forming a thin metallized layer and superposing a metallized layer thereon with the part corresponding to the lower part covered with a mask.

Then AuSn-eutectic solder layers 507 are formed on the higher part and the lower part of the Au/Pt/Ti metallized layer 506 in a pad-like pattern. The pad-like AuSn-eutectic solder layers 507 are, for instance, 150×500 μm in size and are formed at intervals of 10 μm. A GaN-laser diode chip LD is placed on the AuSn-eutectic solder layers 507 and are heated to 330° C. to melt the AuSn-eutectic solder layers 507 and to thereby fix the laser diode chip LD to the AlN sub-mount 9.

Then a AuSn-eutectic solder layer 511 is provided on the heat radiating block 10 on the upper side thereof on which an Au/Ni film 508 and a Au/Pt/Ti metallized layer 509 are formed, and the sub-mount 9 of AlN is placed on the AuSn-eutectic solder layer 511 with the Au/Pt/Ti metallized layer 504 faced downward. Then the AuSn-eutectic solder layer 511 is heated to 310° C. to melt the AuSn-eutectic solder layer 511 and to thereby fix the AlN sub-mount 9 to the heat radiating block 10, whereby the laser diode chip LD is mounted on the heat radiating block 10 by way of the AlN sub-mount 9.

The melting point of the AuSn solder changes with the Au/Sn ratio. Accordingly, by controlling the thickness of the Au/Pt/Ti metallized layer 506 on the sub-mount 9 and the thickness of Au/Pt/Ti metallized layer 504 on the sub-mount 9 independently of each other and controlling the temperatures at which the AuSn-eutectic solder layers 507 and 511 are melted, the Au/Sn ratios in the AuSn-eutectic solder layers 507 and 511 after they are melted can be made higher than those before they are melted by several %, whereby there can be generated a difference between the melting point of the AuSn-eutectic solder layer 507 after it is once melted and the melting point of the AuSn-eutectic solder layer 511 after it is once melted.

By thus generating a difference in melting point, the GaN-laser diode chip LD can be bonded to the AlN sub-mount 9 at a temperature different from that at which the AlN sub-mount 9 is bonded to the heat radiating block 10 of Cu even if the same AuSn-eutectic solder is employed. This is advantageous in suppressing fluctuation in light emitting positions since low melting point solder which is apt to fluctuate the light emitting positions with time need not be used.

Further, in the structure shown in FIG. 6, the GaN-laser diode chip LD is fixed to the heat radiating block 10 with the side on which the element is formed (the pn-j unction side) faced downward in contact with the heat radiating block 10 of Cu and the substrate of the chip LD (of $Al_2O_3$) faced upward, that is, in a so-called junction-down structure.

Further, in the structure shown in FIG. 6, the light emitting points of the GaN-laser diode chip LD are substantially in the positions indicated at Q in FIG. 6. Further, each of the AuSn-eutectic solder layer 507, the Au/Pt/Ti metallized layer 506 and the Au/Ni film 505 is divided into two parts by a space 512. In other words, the GaN-laser diode chip LD is bonded to the sub-mount 9 so that a space 512 is positioned just below the light emitting portion. That is, since the light emitting portion of the laser diode chip LD is not in direct contact with the sub-mount 9, stress is further reduced. Further the space 512 prevents the laser beam emitted from the laser diode chip LD being eclipsed by the sub-mount 9 even if the sub-mount 9 extends beyond the light emitting edge of the laser diode chip LD.

It is possible to form an n-side electrode of the GaN-laser diode chip LD in a position facing the higher part of the Au/Pt/Ti metallized layer 506 with the higher part and the lower part of the Au/Pt/Ti metallized layer 506 electrically insulated from each other and to connect the n-side electrode and the p-side electrode respectively to the higher part and the lower part of the Au/Pt/Ti metallized layer 506.

In this example, since the heat radiating block 10 is formed of Cu which is inexpensive and high in thermal conductivity, heat generated from the GaN-laser diode chip LD can be well dissipated, whereby the laser device can be manufactured at low cost.

Further, in this example, since the GaN-laser diode chip LD is fixed to the AlN sub-mount 9 in a junction-down structure, the light emitting portion of the laser diode chip is positioned nearer to the sub-mount 9 and the heat radiating block 10 as compared with when the substrate side of the diode chip LD is fixed to the sub-mount 9, whereby heat is better dissipated.

Further, since the AuSn-eutectic solder is excellent in characteristics of position change with time, fluctuation with time of the position of the light emitting points of the GaN-laser diode chip LD can be effectively suppressed.

Figure 8:
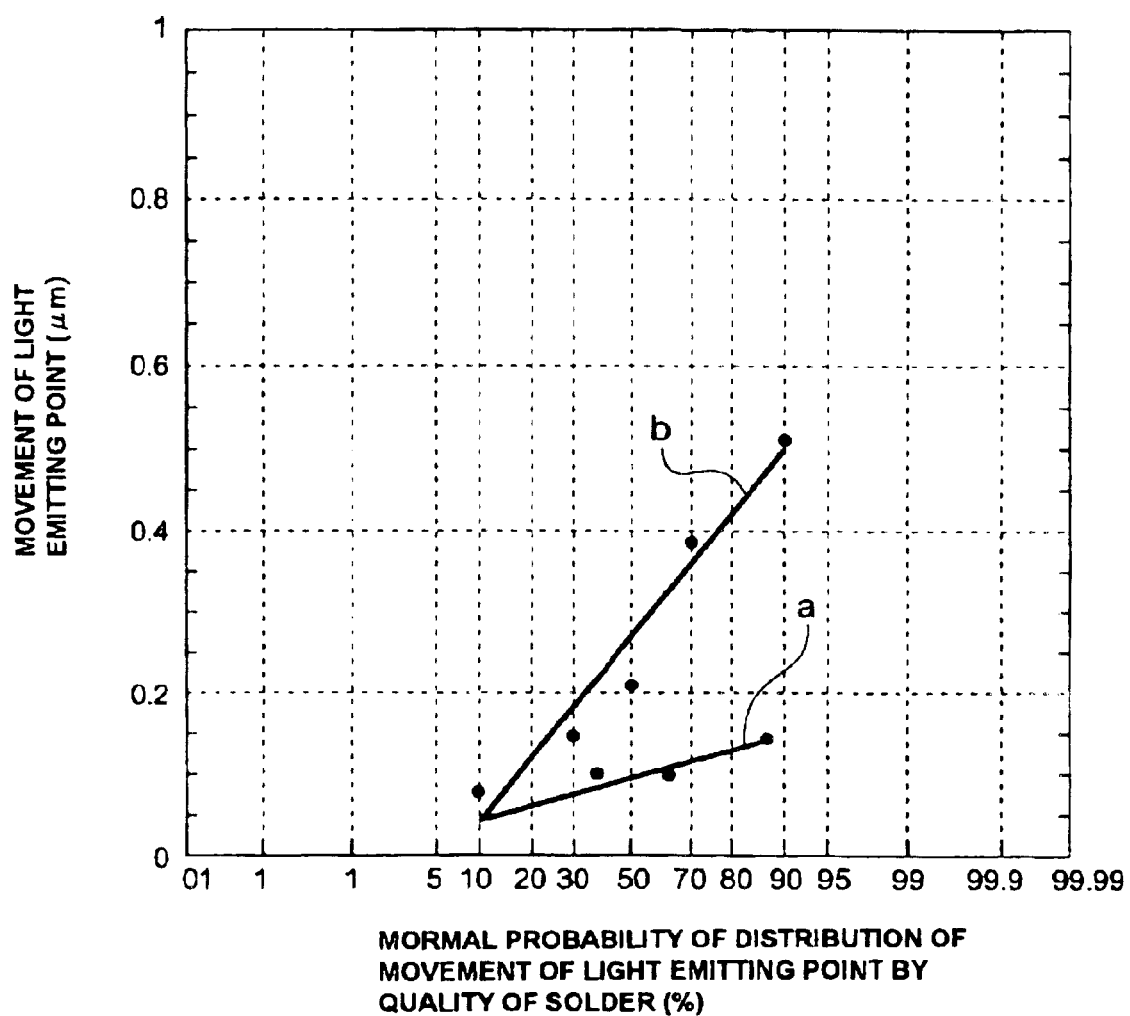
FIG. 8 is a graph showing movement of the light emitting point in the laser diode array of the first embodiment in comparison with a conventional laser diode array.

Line a in FIG. 8 shows up-and-down movement of the light emitting point of the GaN-laser diode chip LD as measured in a change-with-time test in the temperature range from −40 to 80° C. The abscissa of FIG. 8 represents the normal probability distribution of movement of the light emitting point in % by quality of the solder and the ordinate represents up-and-down movement of the light emitting point of the GaN-laser diode chip LD. Line b shows up-and-down movement of the light emitting point of the GaN-laser diode chip LD as measured in the same test except that low-melting point solder is used in place of the AuSn-eutectic solder. As can be seen from FIG. 8, in the laser diode array of this embodiment, the movement of the light emitting points is quite small as compared with in a conventional laser diode array where low-melting point solder is employed.

Figure 9:
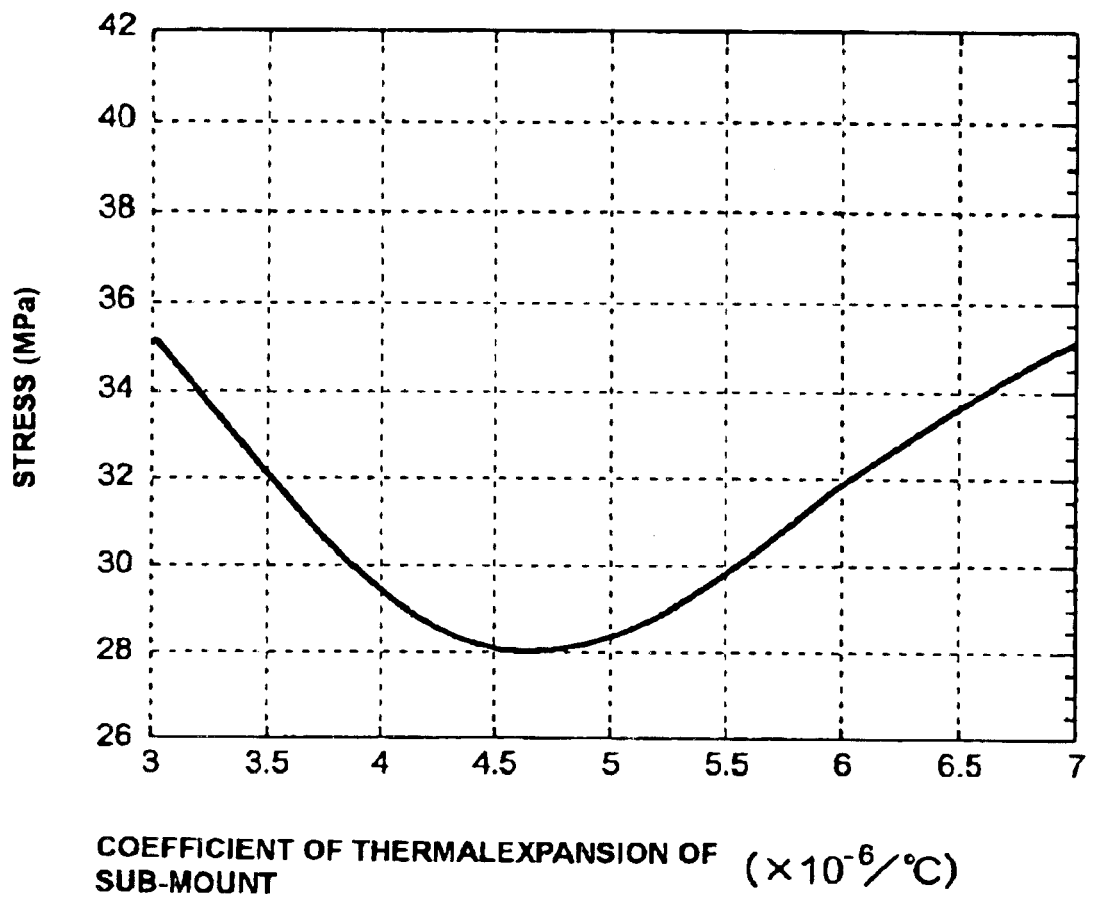
FIG. 9 is graph showing the result of computer simulation for detecting change in stress, acting on the light emitting point of the GaN-laser diode chip LD in the laser diode array of this embodiment due to thermal strain, versus the coefficient of thermal expansion of the sub-mount 9.

FIG. 9 shows the result of computer simulation for detecting change in stress, acting on the light emitting point of the GaN-laser diode chip LD in the laser diode array of this embodiment due to thermal strain, versus the coefficient of thermal expansion of the sub-mount 9. In this simulation, the coefficient of expansion and the Young's modulus of the substrate, the lower clad layer, the light emitting layer, the upper light emitting layer and the insulating layer of the GaN-laser diode chip LD in addition to the AlN sub-mount 9, the Cu heat radiating block 10, the Au/Pt/Ti metallized layers 504, 506 and 509, the Au/Ni film 505 and 508, and the AuSn-eutectic solder layers 507 and 511 are obtained and these values are employed.

As can be seen from FIG. 9, when the coefficient of thermal expansion of the sub-mount 9 is in the range of 3.5~6.0 $10^{-6}/°$ C., the aforesaid stress is not larger than about 32 Mpa and no problem will be involved in practical use of the GaN-laser diode chip. Accordingly, it is preferred that the sub-mount 9 be formed of a material whose coefficient of thermal expansion is in the range of 3.5~6.0×$10^{-6}/°$ C.

When the coefficient of thermal expansion of the sub-mount 9 is in the range of 4.0~5.4×$10^{-6}/°$ C., the aforesaid stress is not larger than about 29.5 Mpa. Accordingly, more preferably the sub-mount 9 is formed of a material whose coefficient of thermal expansion is in the range of 4.0~5.4×$10^{-6}/°$ C. When the coefficient of thermal expansion of the sub-mount 9 is in the range of 4.4~4.8×$10^{-6}/°$ C., the aforesaid stress is not larger than about 28 Mpa. Accordingly, most preferably the sub-mount 9 is formed of a material whose coefficient of thermal expansion is in the range of 4.4~4.8×$10^{-6}/°$ C.

Figure 10:
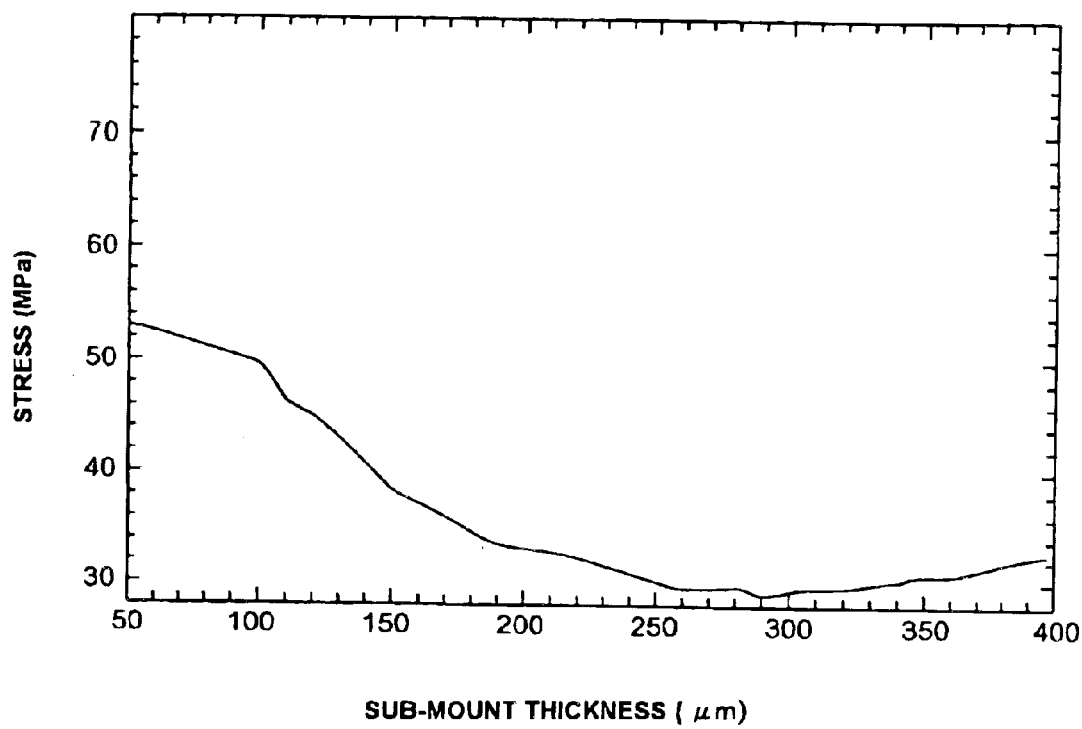
FIG. 10 is a graph showing the result of computer simulation for detecting change in stress, acting on the light emitting point of the GaN-laser diode chip LD in the laser diode array of this embodiment due to thermal strain, versus the thickness of the AlN sub-mount 9.

FIG. 10 shows the result of computer simulation for detecting change in stress, acting on the light emitting point of the GaN-laser diode chip LD in the laser diode array of this embodiment due to thermal strain, versus the thickness of the AlN sub-mount 9. In this simulation, the coefficient of expansion and the Young's modulus of the substrate, the lower clad layer, the light emitting layer, the upper light emitting layer and the insulating layer of the GaN-laser diode chip LD in addition to the AlN sub-mount 9, the Cu heat radiating block 10, the Au/Pt/Ti metallized layers 504, 506 and 509, the Au/Ni film 505 and 508, and the AuSn-eutectic solder layers 507 and 511 are obtained and these values are employed.

As can be seen from FIG. 10, when the thickness of the AlN sub-mount 9 is in the range of 200 to 400 μm, the aforesaid stress is not larger than about 34 Mpa and no problem will be involved in practical use of the GaN-laser diode chip LD. When stress larger than 34 Mpa acts on the light emitting point of the GaN-laser diode chip LD, stress is apt to be generated there. Accordingly, it is preferred that the AlN sub-mount 9 be in the range of 200 to 400 μm in thickness. When the thickness of the AlN sub-mount 9 is in the range of 250 to 350 µm, the aforesaid stress is not larger than about 32 Mpa. Accordingly, more preferably the AlN sub-mount 9 is in the range of 250 to 350 µm in thickness.

The AlN sub-mount 9 undergoes heavy compression stress from the Cu heat radiating block 10 in addition to compression stress from the GaN-laser diode chip LD. Generally the latter compression stress is lighter than the former.

As will be described later, in the case where laser beams emitted from a plurality of light emitting points are condensed and coupled in a multimode optical fiber, fluctuation in positions of the light emitting points with time deteriorates the efficiency of coupling. When fluctuation in positions of the light emitting points with time can be suppressed in the manner described above, deterioration of the efficiency of coupling can be prevented.

Figure 11:
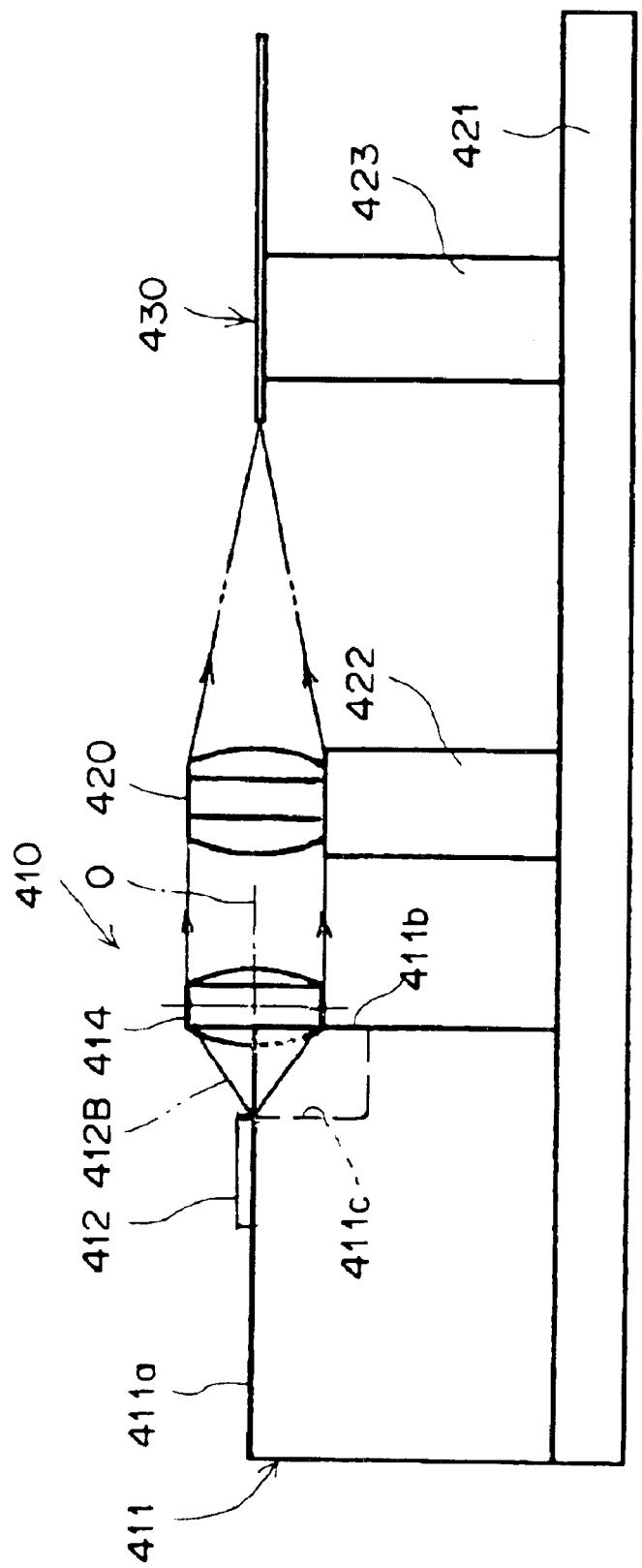
FIG. 11 is a side view showing a laser device in accordance with a second embodiment of the present invention.
Figure 12:
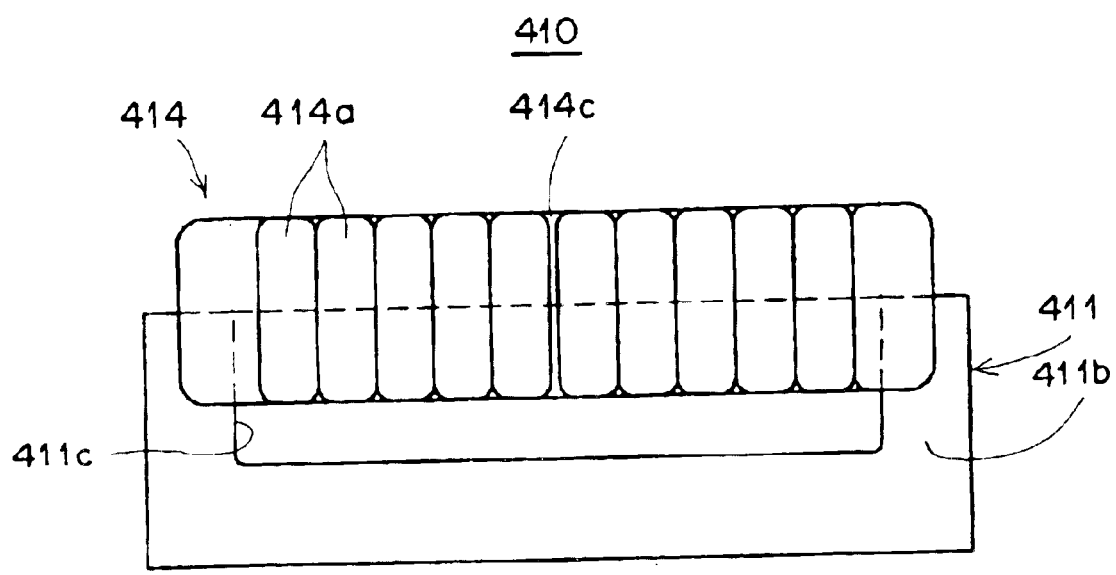
FIG. 12 is a front view of the laser device.
Figure 13:
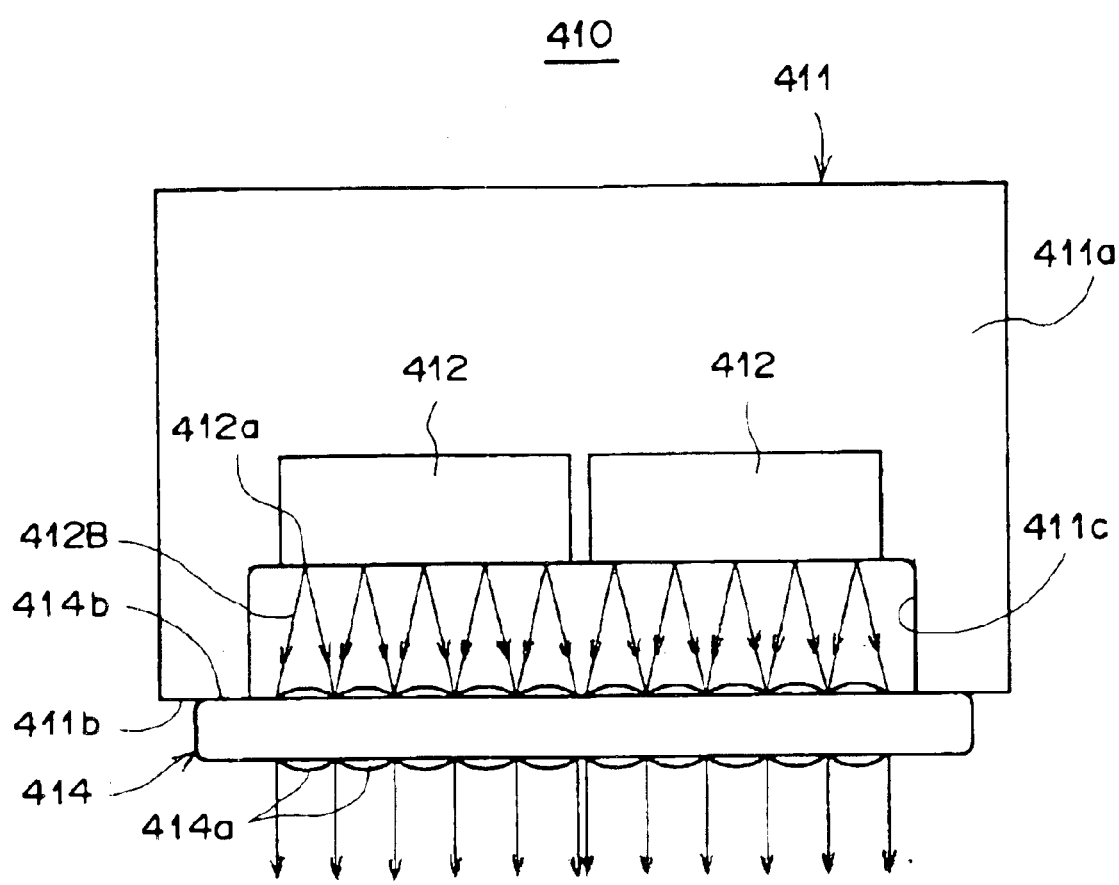
FIG. 13 is a plan view of the laser device.

A laser device in accordance with a second embodiment of the present invention will be described with reference to FIGS. 11 to 17, hereinbelow. As shown in FIGS. 11 to 13, the laser device of the second embodiment of the present invention comprises a heat block (stem) 411 of Cu, and a pair of multi-cavity laser diode chips 412 and a collimator lens array 414 fixed on the heat block 411. The collimator lens array may be formed of either synthetic resin or glass.

The multi-cavity laser diode chip 412 is, for instance, a GaN-laser diode chip which oscillates at 405 nm and is provided with, for instance, five cavities or light emitting points 412a. The multi-cavity laser diode chips 412 are arranged on the heat block 411 in the direction in which the light emitting points 412a in each of the multi-cavity laser diode chips 412 are arranged. In this particular embodiment, the five light emitting points 412a are at pitches of 0.35 mm, and each of the diode chips 412 is 1.75 mm in width and not larger than 1 µm in warping of the substrate. Each of the light emitting points 412a emits a laser beam 412B at 30 mW.

The heat block 411 comprises a horizontal laser fixing surface 411a on which the multi-cavity laser diode chips 412 are fixed, a lens locator surface 411b formed forward (as seen in direction in which the laser beams 412B are emitted) of the multi-cavity laser diode chips 412, and a recess 411c for preventing eclipse of the laser beams 412B emitted from the light emitting points 412a in a divergent beam.

The laser fixing surface 411a is a highly flat surface not larger than 0.5 µm in flatness. In order to well dissipate heat generated from the multi-cavity laser diode chips 412 and to suppress temperature increase in the chips 412, the multi-cavity laser diode chips 412 are fixed to the laser fixing surface 411a to each other by brazing material.

The lens locator surface 411b is formed in perpendicular to the optical axes O of the laser beams 412B emitted from the light emitting points 412a at a predetermined distance from the light emitting points 412a (axes of light emission of the multi-cavity laser diode chips 412). The lens locator surface 411b is also a highly flat surface not larger than 0.5 µm in flatness.

When the multi-cavity laser diode chips 412 are fixed to the heat block 411 by a brazing material such as AuSN, the multi-cavity laser diode chips 412 and the heat block 411 are heated to about 300° C. higher than the melting point of the brazing material (about 280° C.). When fixing the multi-cavity laser diode chips 412 to the heat block 411, the heat block 411 and the brazing material thereon are preheated to about 250° C. to soften the brazing material and then the diode chips 412 are precisely positioned on the brazing material. At this time, the heat block 411, the brazing material and the chips 412 are moved relatively to each other due to thermal expansion. In order to position the multi-cavity laser diode chips 412 at a high accuracy of 0.1 to 0.3 µm, a reference mark is put on the upper surface or side surface of the heat block 411 near to the light emitting point. Especially when the reference mark is put on an extension of the optical axis in the direction in which the laser beam is emitted, since no movement is generated by thermal expansion in the horizontal direction perpendicular to the optical axis, the multi-cavity laser diode chips 412 can be positioned at a high accuracy of 0.1 to 0.3 µm in the horizontal direction where tolerance in locating the multi-cavity laser diode chip 412 and the lens is strict and small. As a result, laser beams emitted from a plurality of multi-cavity laser diode chips can be accurately converged in a predetermined position, whereby a high fiber coupling efficiency can be realized.

The collimator lens array 414 comprises ten collimator lens elements 414a integrated in a row. In this particular embodiment, each of the collimator lens elements 414a is shaped like an elongated section of a lens obtained by cutting a part including the optical axis from a lens symmetrical about its optical axis, and is 0.9 mm and 1.1 mm respectively in focal length f and effective height. The aspect ratio of each collimator lens element 414a is selected depending on the cross-sectional shape of the laser beam 412B and is, for instance, 3:1. The ten collimator lens elements 414a are arranged at the same pitches (0.35 mm with an error of within 0.2 µm) as the light emitting points of the multi-cavity laser diode chips 412 except between the fifth collimator lens element (as numbered from left) and the sixth collimator lens element. Between the fifth collimator lens element and the sixth collimator lens element, there is provided a gap 414c of 0.05 mm opposed to the gap between the two multi-cavity laser diode chips 412.

The collimator lens array 414 has left and right extensions extending beyond the leftmost and rightmost collimator lens elements 414a. The rear end faces 414b of the left and right extensions are processed into highly flat surfaces, and the collimator lens array 414 is fixed to the heat block 411 by bonding the rear end faces 414b of the left and right extensions to the lens locator surface 411b of the heat block 411 by adhesive.

At this time, the collimator lens array 414 should be located with respect to the heat block 411 so that the ten optical axes O of the laser beams 412B emitted from the respective light emitting points 412a of the multi-cavity laser diode chips 412 are respectively aligned with the optical axes of the ten collimator lens elements 414a. In this embodiment, by moving the collimator lens array 414 up and down and left and right in a plane perpendicular to the optical axes of the lens elements 414a while pressing the rear end faces 414b against the lens locator surface 411b of the heat block 411, the collimator lens array 414 can be easily located with respect to the heat block 411.

The lens locator surface 411b is set with respect to the position in which the laser diode array 414 is fixed to the heat block 411 so that when the collimator lens array 414 is located with respect to the heat block 411 in the manner described above, the focal point of each collimator lens element 414a is automatically brought to the corresponding light emitting point 412a. That is, when the collimator lens array 414 is located with respect to the heat block 411 in the manner described above, each collimator lens element 414a is automatically positioned in a proper position in the direction of the optical axis of the laser beam 412B emitted from the corresponding light emitting point 412a in which the collimator lens element 414a can precisely convert the divergent laser beam 412B into a parallel laser beam.

It is possible to locate the collimator lens array 414 with respect to the heat block 411 by fixing other surfaces. For example, mounting portions extending left and right may be formed on the heat block 411 and surfaces of the collimator lens array 414 parallel to the optical axes, e.g., the lower surface as seen in FIG. 11, may be fixed on the upper surface of the mounting portions.

Since the lens locator surface 411b of the heat block 411 is a highly flat surface in this embodiment, the collimator lens array 414 can be precisely located with respect to the heat block 411.

Further, since the laser fixing surface 411a is also a highly flat surface in this embodiment, the multi-cavity laser diode chips 412 can be precisely located with respect to the heat block 411.

In the laser device 410 of this embodiment, a plurality of laser beams 412B emitted from the plurality of light emitting points 412a are coupled into a high intensity laser beam as shown in FIG. 11. That is, the heat block 411 of the laser device 410 is fixed on a base plate 421, and a condenser lens holder 422 which holds a condenser lens 420 and a fiber holder 423 which holds light inlet end portion of a multi-mode optical fiber 430 are fixed on the base plate 421.

The ten laser beams 412B which are collimated by the respective collimator lens elements 414a are condensed by the condenser lens 420 and converged on the light inlet end face of the core (not shown) of the multimode optical fiber 430. The laser beams 412B propagate through the core of the multimode optical fiber 430 and coupled into a laser beam. As the multimode optical fiber 430, a step index fiber, a graded index fiber or an optical fiber of a composite type of these fibers can be used.

In this particular embodiment, the condenser lens 420 is 6 mm in width, 1.8 mm in effective height and 14 mm in focal length. The multimode optical fiber 430 is 50 $\mu$m in core diameter, and 0.2 in numerical aperture NA. The ten laser beams 412B are condensed by the condenser lens 420 and converged in an area of about 30 $\mu$m in diameter on the end face of the core of the multimode optical fiber 430. The total of a loss in the fiber coupling and a loss generated when the laser beams are transmitted through the collimator lens element 414a and the condenser lens 420 is about 10%. In this case, if the power of each laser beam 412B is 30 mW, the laser device 410 of this embodiment outputs a coupled laser beam of high brightness and high power (270 mW).

Instead of using a pair of multi-cavity laser diode chips 412 each having five light emitting points, a single multi-cavity laser diode chip which is not larger than 3 mm in width and has ten light emitting points. However, deflection generally called "smile" is more apt to be generated during production of the multi-cavity laser diode chips as the number of the light emitting points increases and the width of the chips increases. In order to prevent generation of such deflection, it is preferred that a plurality of multi-cavity laser diode chips having a relatively small number of light emitting points are used side by side.

A multi-cavity laser diode chip having five light emitting points at intervals of 350 $\mu$m is about 2.1 mm in width and warping of such a multi-cavity laser diode chip can be suppressed to not larger than 1 $\mu$m, and in this case, fluctuation in height of the light emitting points can be suppressed to not larger than 2 $\mu$m even if fluctuation in mounting height of the multi-cavity laser diode chips is 1 $\mu$m, whereby a high fiber coupling efficiency can be realized.

To the contrast, a multi-cavity laser diode chip having ten light emitting points is about 3.5 mm in width, and warping of such a multi-cavity laser diode chip can be as large as 3 $\mu$m. In this case, fluctuation in height of the light emitting points (including fluctuation in mounting height of the multi-cavity laser diode chips) can be as large as 4 $\mu$m, which is too large to realize a high fiber coupling efficiency.

The number of light emitting points in each multi-cavity laser diode chip and the number of multi-cavity laser diode chips employed need not be limited to those described above. For example, it is possible to provide a pair of multi-cavity laser diode chips having 7 light emitting points to generate 14 laser beams. Similarly it is possible to provide three multi-cavity laser diode chips having 5 light emitting points to generate 15 laser beams. In the latter case, if the power of each laser beam is 30 mW and the laser beams are coupled into a single laser beam with a loss of 10%, a coupled laser beam of high brightness and high power (450 mW) can be obtained.

By enclosing the overall wave-coupling module in an air-tight casing, its service life can be elongated.

Figure 14:
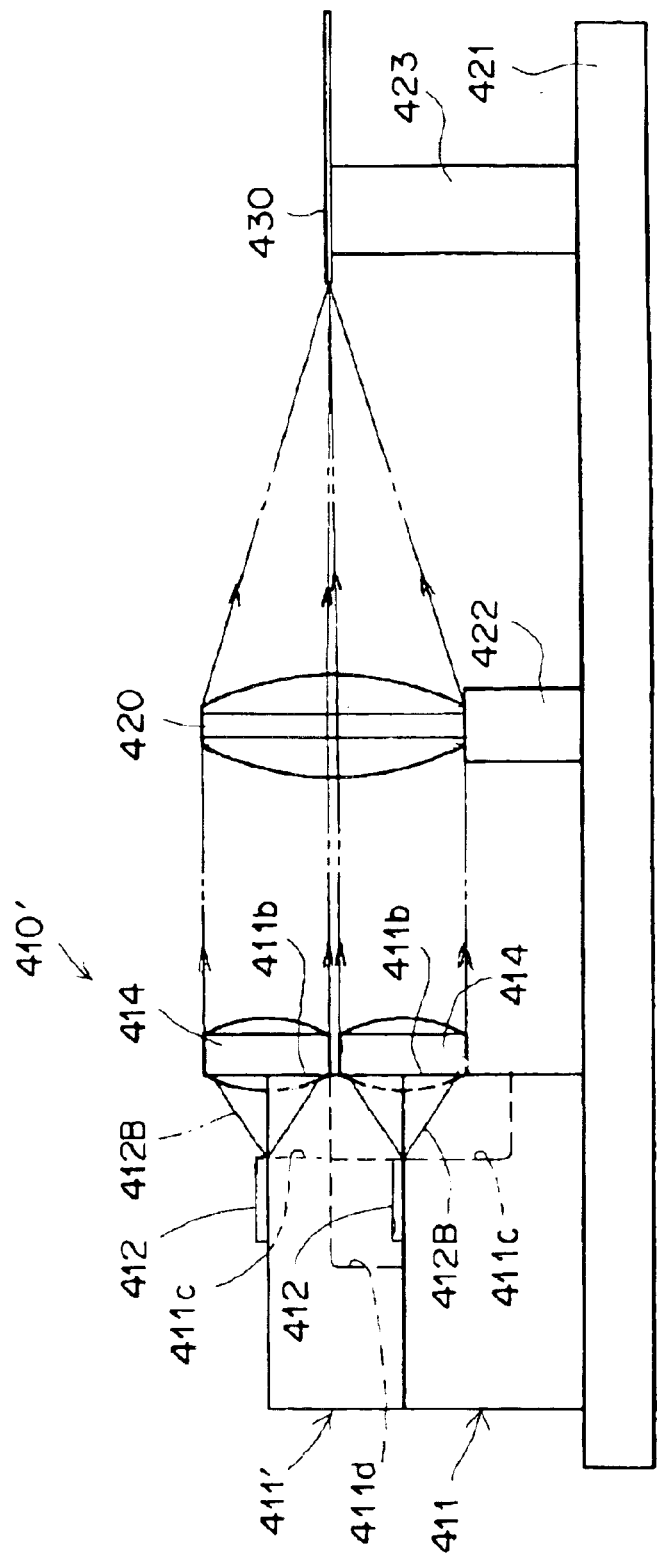
FIG. 14 is a side view showing a laser device in accordance with a third embodiment of the present invention.
Figure 15:
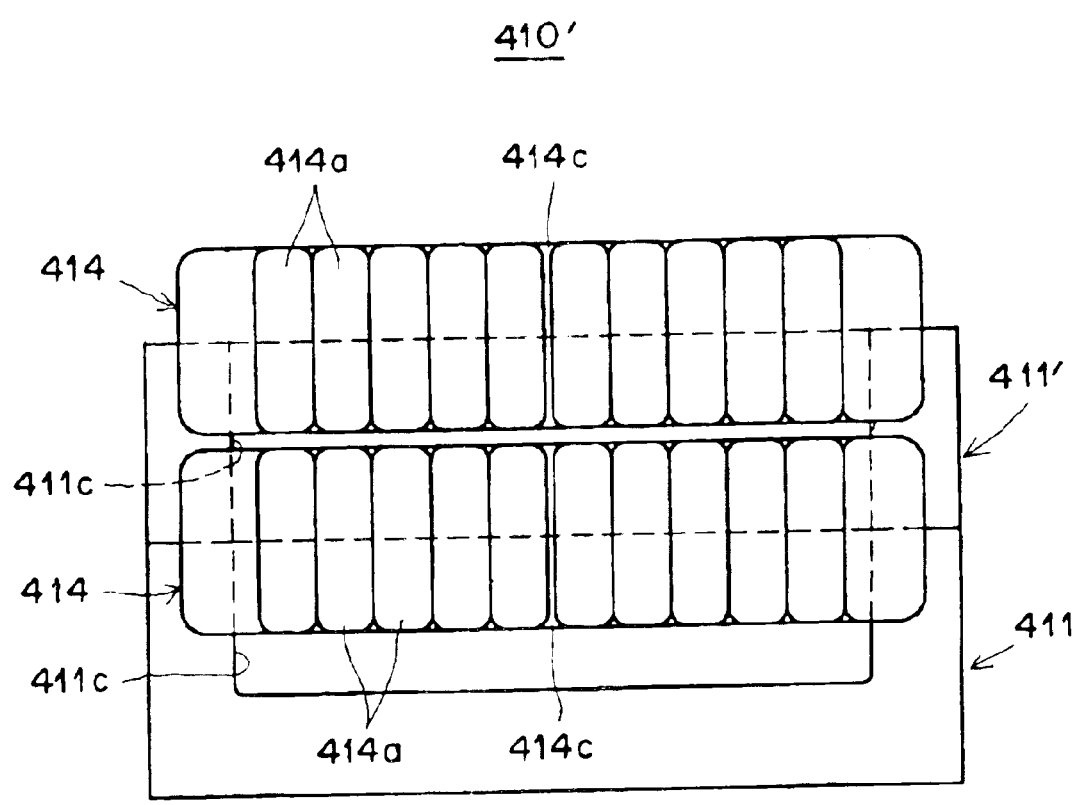
FIG. 15 is a front view of the laser device.

A laser device 410' in accordance with a third embodiment of the present invention will be described with reference to FIGS. 14 and 15, hereinbelow. In FIGS. 14 and 15, elements analogous to those in FIGS. 11 to 13 are given the same reference numerals and will not be described unless otherwise necessary. The shape of the laser device 410' of this embodiment in plan is basically the same as that of the second embodiment shown in FIG. 13 and is not shown here.

The laser device 410' of this embodiment basically differs from that of the second embodiment shown in FIGS. 11 to 13 in that four multi-cavity laser diode chips 412 are arranged in two rows and two columns. That is, a second heat block 411' the same as the heat block 411 described above is placed on the heat block 411 and fixed to the same. A pair of multi-cavity laser diode chips 412 and a collimator lens array 414 are fixed to each of the heat blocks 411 and 411'. The second heat block 411' is substantially of the same structure as the heat block 411 and is provided with a recess 411c for preventing eclipse of the laser beams 412B. The second heat block 411' is further provided with a recess 411d for preventing interference with the multi-cavity laser diode chips 412 fixed to the lower heat block 411.

Also in this embodiment, by moving the collimator lens array 414 up and down and left and right in a plane perpendicular to the optical axes of the lens elements 414a while pressing the rear end faces 414b against the lens locator surfaces 411b of the heat blocks 411 and 411', the collimator lens array 414 can be easily and precisely located with respect to the multi-cavity laser diode chips 412.

In this embodiment, the multi-cavity laser diode chips 412, the collimator lens array 414, the condenser lens 420 and the multimode optical fiber 430 are substantially the same in specification as those of the second embodiment shown in FIGS. 11 to 13. Accordingly, in this embodiment, if the power of the laser beam emitted from each of the 20 light emitting points is 30 mW, a coupled laser beam of high brightness and high power (540 mW) can be obtained.

Figure 16:
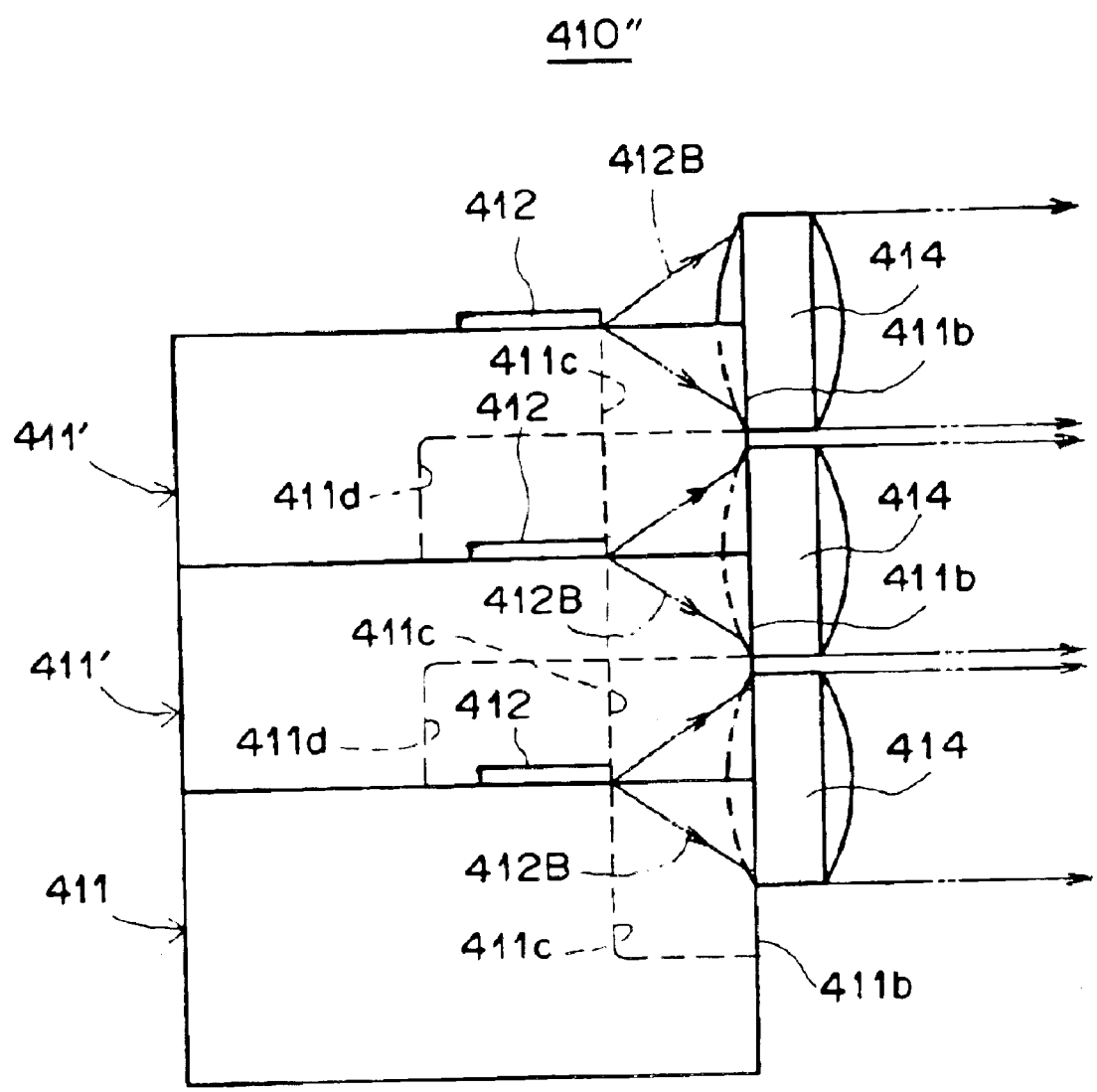
FIG. 16 is a side view showing a laser device in accordance with a fourth embodiment of the present invention.
Figure 17:
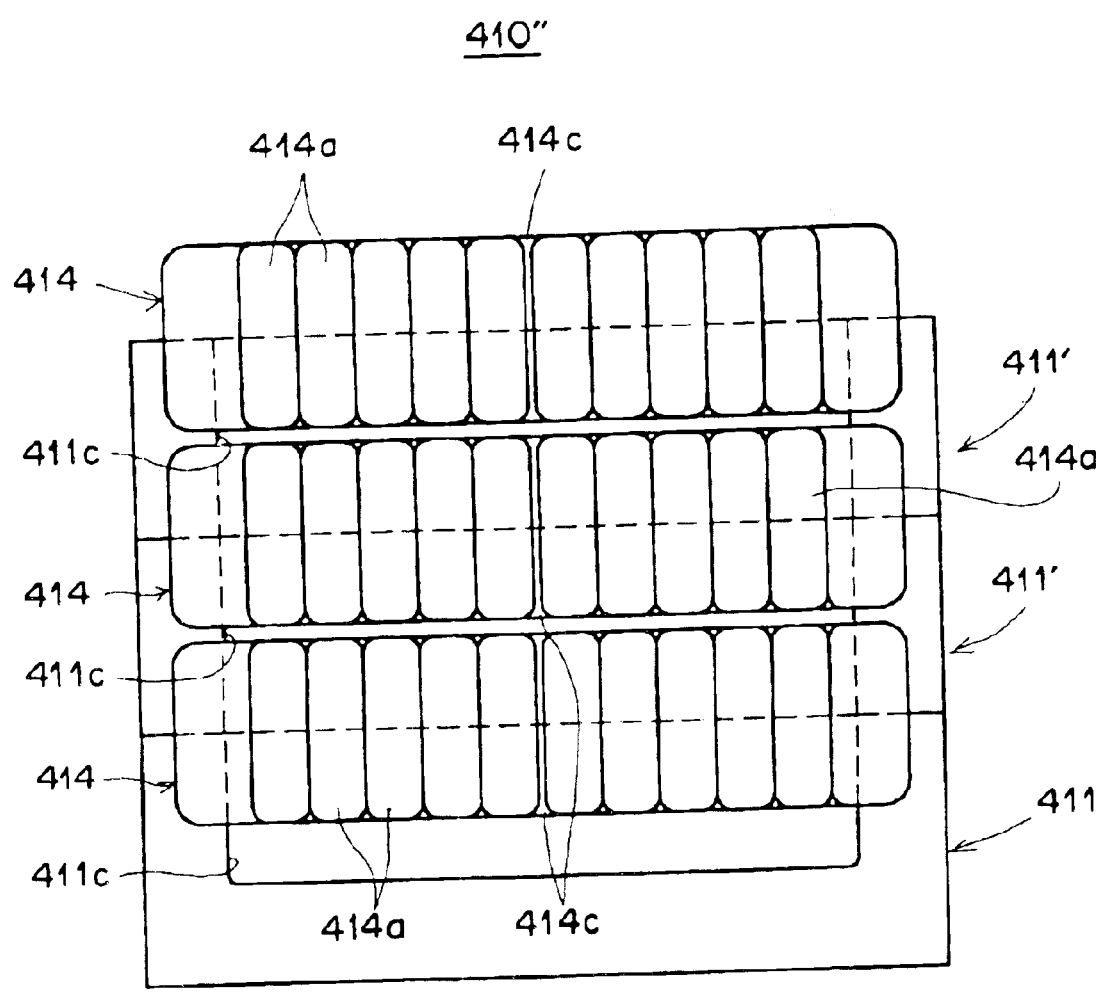
FIG. 17 is a front view of the laser device.

A laser device 410" in accordance with a fourth embodiment of the present invention will be described with reference to FIGS. 16 and 17, hereinbelow. In FIGS. 16 and 17, elements analogous to those in FIGS. 11 to 13 are given the same reference numerals and will not be described unless otherwise necessary. The shape of the laser device 410" of this embodiment in plan is basically the same as that of the second embodiment shown in FIG. 13 and is not shown here.

The laser device 410'' of this embodiment basically differs from that of the second embodiment shown in FIGS. 11 to 13 in that six multi-cavity laser diode chips 412 are arranged in three rows and two columns. That is, second and third heat blocks 411' the same as the heat block 411 described above are placed on the heat block 411 and fixed to the same. A pair of multi-cavity laser diode chips 412 and a collimator lens array 414 are fixed to each of the heat blocks 411 and 411'. The second and third heat blocks 411' are of the same structure as the heat block 411' employed in the third embodiment.

Also in this embodiment, by moving the collimator lens array 414 up and down and left and right in a plane perpendicular to the optical axes of the lens elements 414a while pressing the rear end faces 414b against the lens locator surfaces 411b of the heat blocks 411 and 411', the collimator lens array 414 can be easily and precisely located with respect to the multi-cavity laser diode chips 412.

In this embodiment, the multi-cavity laser diode chips 412, the collimator lens array 414, the condenser lens 420 and the multimode optical fiber 430 are substantially the same in specification as those of the second embodiment shown in FIGS. 11 to 13. Accordingly, in this embodiment, if the power of the laser beam emitted from each of the 30 light emitting points is 30 mW, a coupled laser beam of high brightness and high power (810 mW) can be obtained.

The collimator lens array used in the second to fourth embodiments may be integrated with a condenser lens 420 shown in FIG. 11 to double as a condenser lens.

Further, the laser device in accordance with the present invention may be arranged so that the laser beams are not condensed after being collimated.

Further, those other than GaN-laser diode chip can be used as the multi-cavity laser diode chip in the laser device of this invention.

Figure 18:
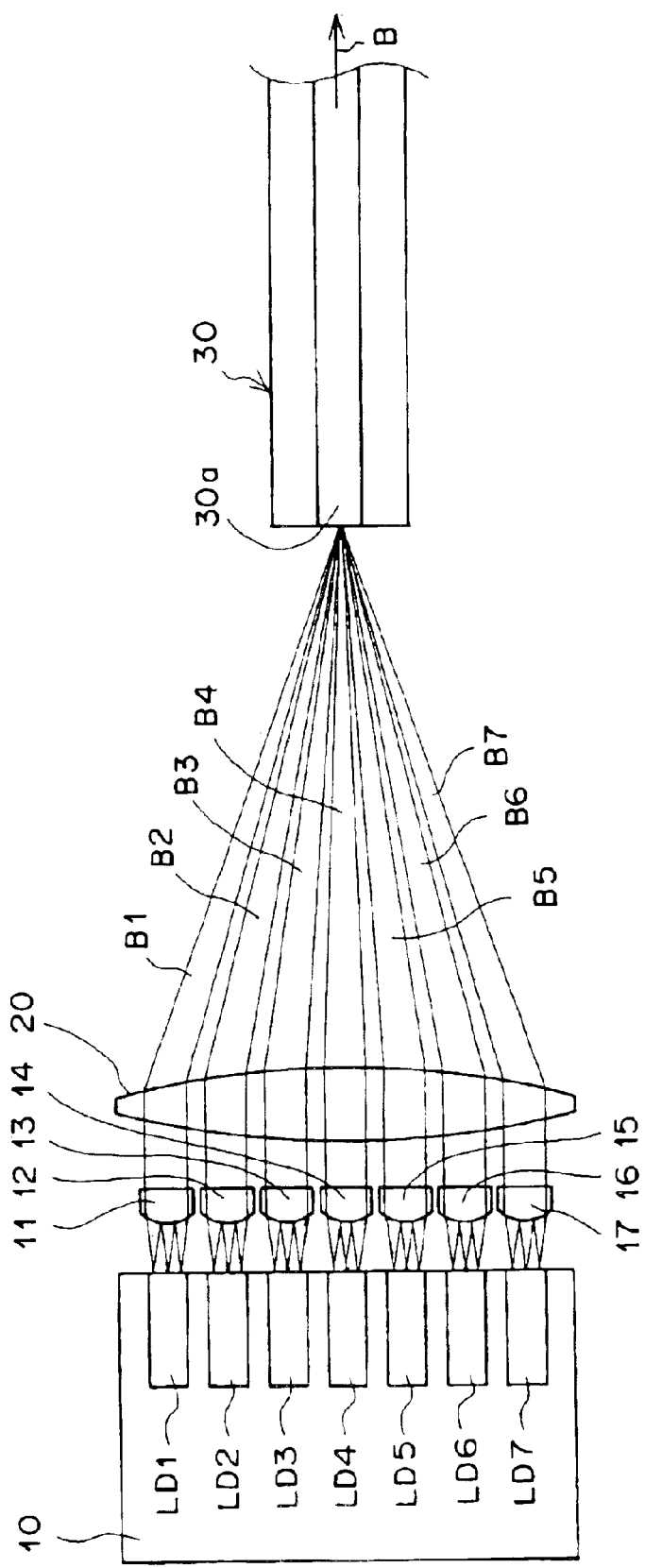
FIG. 18 is a plan view showing a wave-coupling laser source in accordance with a fifth embodiment of the present invention.

A wave-coupling laser source in accordance with a fifth embodiment of the present invention will be described, hereinbelow. As shown in FIG. 18, the wave-coupling laser source of this embodiment comprises seven transverse multimode GaN-laser diode chips LD1, LD2, LD3, LD4, LD5, LD6 and LD7 fixed on a heat block 10 of Cu, seven collimator lens arrays 11 to 17 each for one of the seven laser diode chips LD1 to LD7, a condenser lens 20 and a multimode optical fiber 30. Each of the GaN-laser diode chips is a multi-cavity laser diode chip having a plurality of (three in this particular embodiment) light emitting points.

Figure 19:
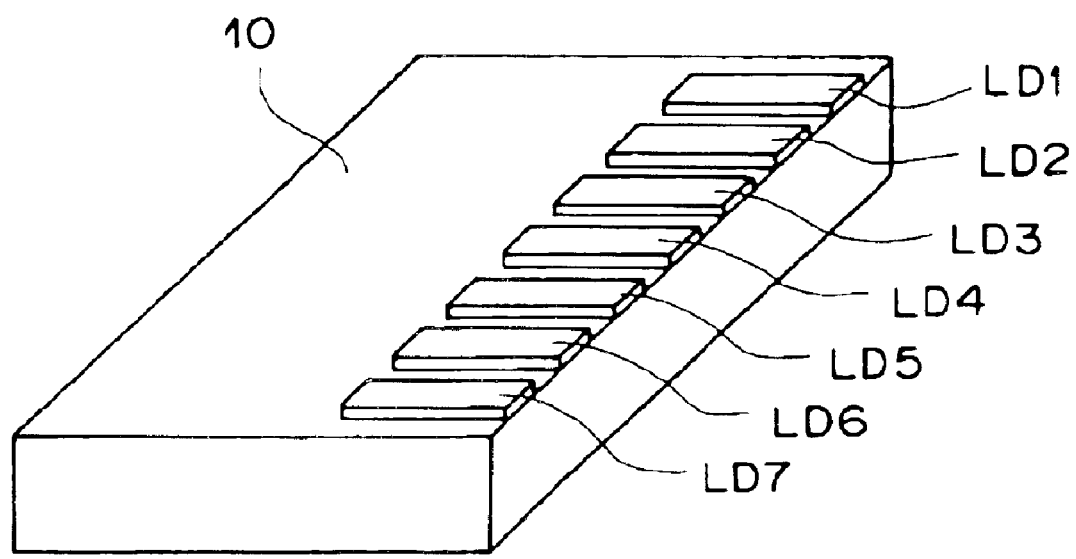
FIG. 19 is a perspective view of the semiconductor laser of the wave-coupling laser.

FIG. 18 shows the basic structure of a wave-coupling laser source in accordance with the fifth embodiment of the present invention, and the collimator lens arrays 11 to 17 and the condenser lens 20 are shown only schematically. Especially, though not clearly shown in FIG. 18, each of the collimator lens arrays 11 to 17 comprises a plurality of collimator lens elements which are the same in number as the light emitting points in each multi-cavity laser diode chip. Mounting of the laser diode chips LD1 to LD7 on the heat block 10 is shown in FIG. 19.

Each of the laser diode chips LD1 to LD7 oscillates at 405 nm and 100 mW in maximum output power. Laser beams B1 to B7 each comprising a plurality of laser beams emitted from the light emitting points of each of the laser diode chips LD1 to LD7 as divergent laser beams are collimated by the respective collimator lens arrays 11 to 17.

The collimated laser beams B1 to B7 are condensed by the condenser lens 20 and converged on the light inlet end face of the core 30a of the multimode optical fiber 30. In this embodiment, a condenser optical system is formed by the collimator lens arrays 11 to 17 and the condenser lens 20 and a coupling optical system is formed by the multimode optical fiber 30. That is, the laser beams B1 to B7 condensed by the condenser lens 20 propagate through the core 30a of the multimode optical fiber 30 and coupled into a laser beam B. As the multimode optical fiber 30, a step index fiber, a graded index fiber or an optical fiber of a composite type of these fibers can be used.

Figure 20:
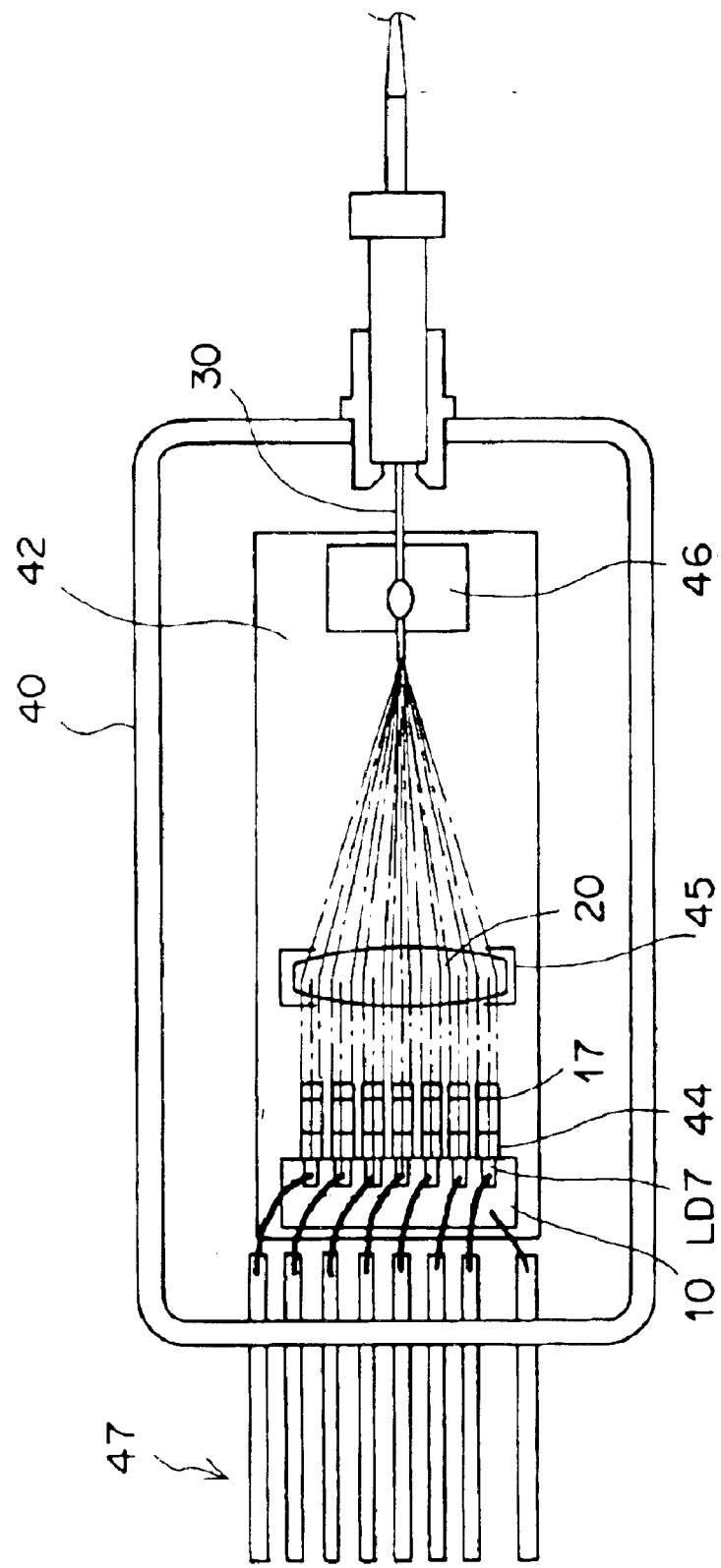
FIG. 20 is a side view showing an ultraviolet high-brightness wave-coupling fiber module using a wave-coupling laser source of the present invention.
Figure 21:
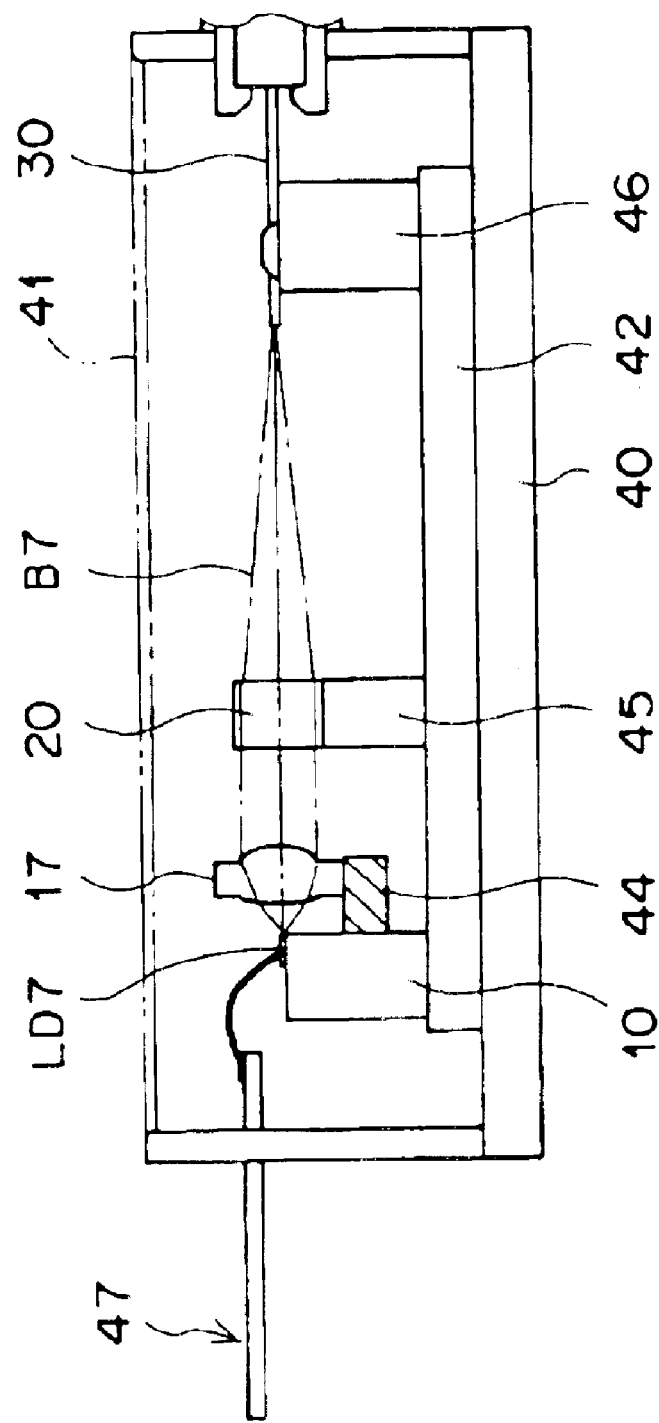
FIG. 21 is a side view of the same.

An ultraviolet high-brightness wave-coupling fiber module using the wave-coupling laser source of the fifth embodiment will be described in detail with reference to FIGS. 20 and 21, hereinbelow. With reference to FIGS. 20 and 21, the shape and mounting of the collimator lens array 11 to 17 and the condenser lens 20 will be described in detail.

In the module, the optical elements are enclosed in a box-like package 40 having an opening which is open upward and closed by a lid 41.

A base plate 42 is fixed to the bottom of the package 40 and the heat block 10 is mounted on the upper surface of the base plate 42. A collimator lens array holder 44 which holds the collimator lens arrays 11 to 17 is fixed to the heat block 10. Further, a condenser lens holder 45 which holds the condenser lens 20 and fiber holder 46 which holds the light inlet end portion of the multimode optical fiber 30 are mounted on the upper surface of the base plate 42. Wiring 47 for driving the diode chips LD1 to LD7 extends outside through openings formed in a side wall of the package 40.

In this particular embodiment, each of the GaN-laser diode chips LD1 to LD7 is 2 $\mu$m in light emitting width and 10° and 30° in angles of divergence respectively in a direction parallel to the active layer and in a direction perpendicular to the active layer. In the GaN-laser diode chips LD1 to LD7, the light emitting points are arranged in a direction parallel to the active layer.

As the multimode optical fiber 30, is used a multimode optical fiber which is of a graded index type at the center of the core and of a step index type at the outer periphery of the core, is 25 $\mu$m in core diameter, 0.3 in numerical aperture NA and not smaller than 99.5% in transmittance of the coating on the light inlet end face and is obtained by modifying a graded index fiber (produced by "Mitsubishi Wire Inc."). A step index fiber which is 25 $\mu$m or 50 $\mu$m in core diameter, 0.2 in numerical aperture NA and not smaller than 99.5% in transmittance of the coating on the light inlet end face may be used instead. It is preferred that the value of the core diameter×numerical aperture be not larger than 10 when a fiber light source of high brightness is used.

In this embodiment, the coupling efficiency in coupling the laser beams B1 to B7 to the multimode fiber 30 is 0.9. Accordingly, when the output power of each of the GaN-laser diode chips LD1 to LD7 (the total output power of a plurality of laser beams emitted from the light emitting points of each chip) is 100 mW, a wave-coupling laser beam B of 630 mW (100 mW×0.9×7) is obtained.

Figure 22:
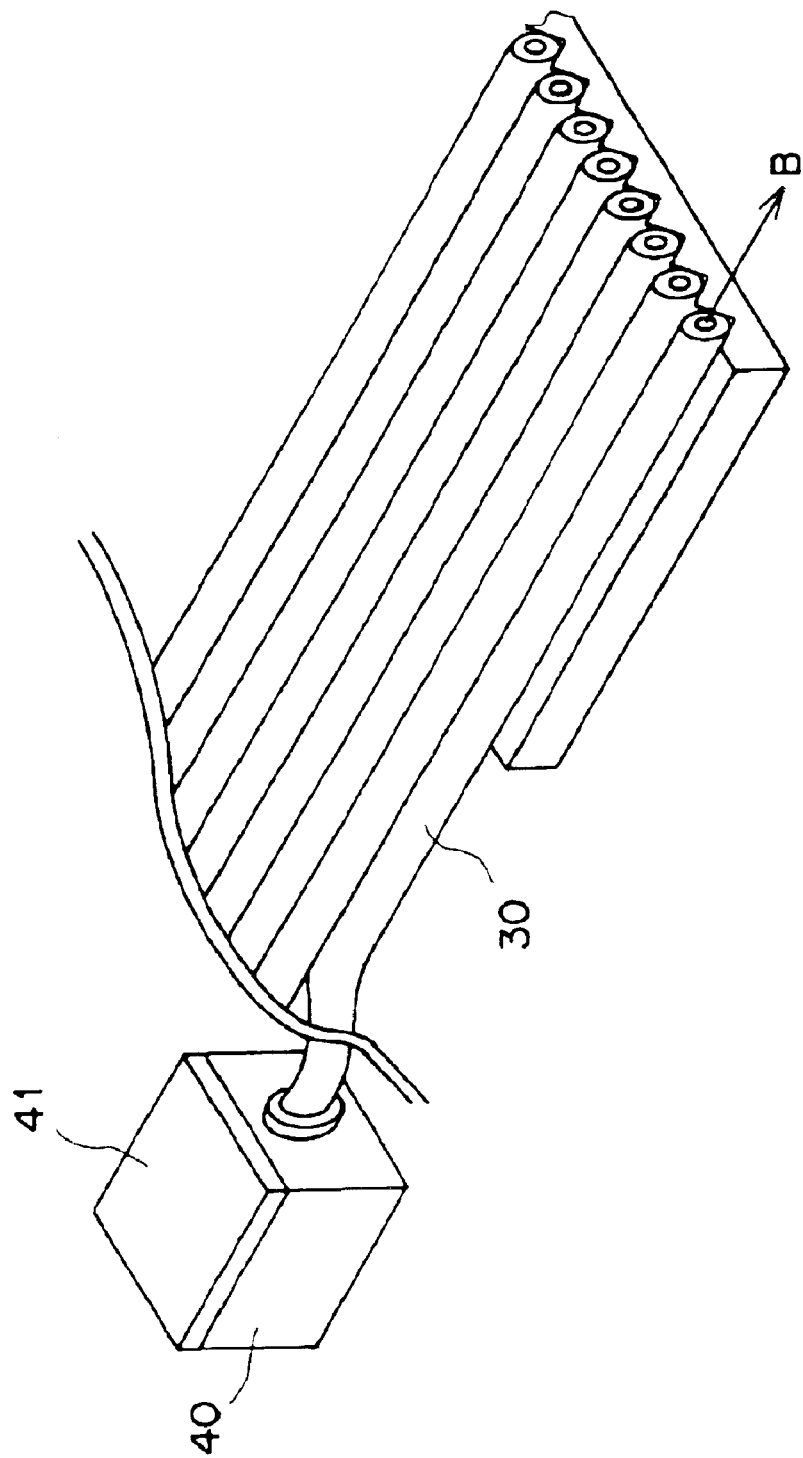
FIG. 22 is a perspective view showing a light source comprising a plurality of wave-coupling fiber modules described above.

When a plurality of ultraviolet high-brightness wave-coupling fiber modules described above are arranged so that the light inlet end portions of the respective multimode optical fibers are linearly arranged as shown in FIG. 22, a light source in which a high-brightness ultraviolet laser beam B is emitted from each of the multimode optical fiber 30 can be formed. Specifically, when 16 wave-coupling fiber modules each emitting a wave-coupling laser beam B of 630 mW are arranged side by side, an optical density of as high as {10 W/(125 $\mu$m×16)=5 W/mm} with an output power of as high as 10 W can be realized and at the same time, an energy efficiency as high as 15%, which is substantially equivalent to the light emitting efficiency of the GaN-laser diode chip, can be realized.

It is possible to form a light source in which the light exit end portions of the multimode optical fibers 30 are arranged in the form of a bundle. Such a light source is generally suitable as an exposure device combined with a one- or two-dimensional optical modulator. Such an exposure device will be described in detail later.

Figure 23:
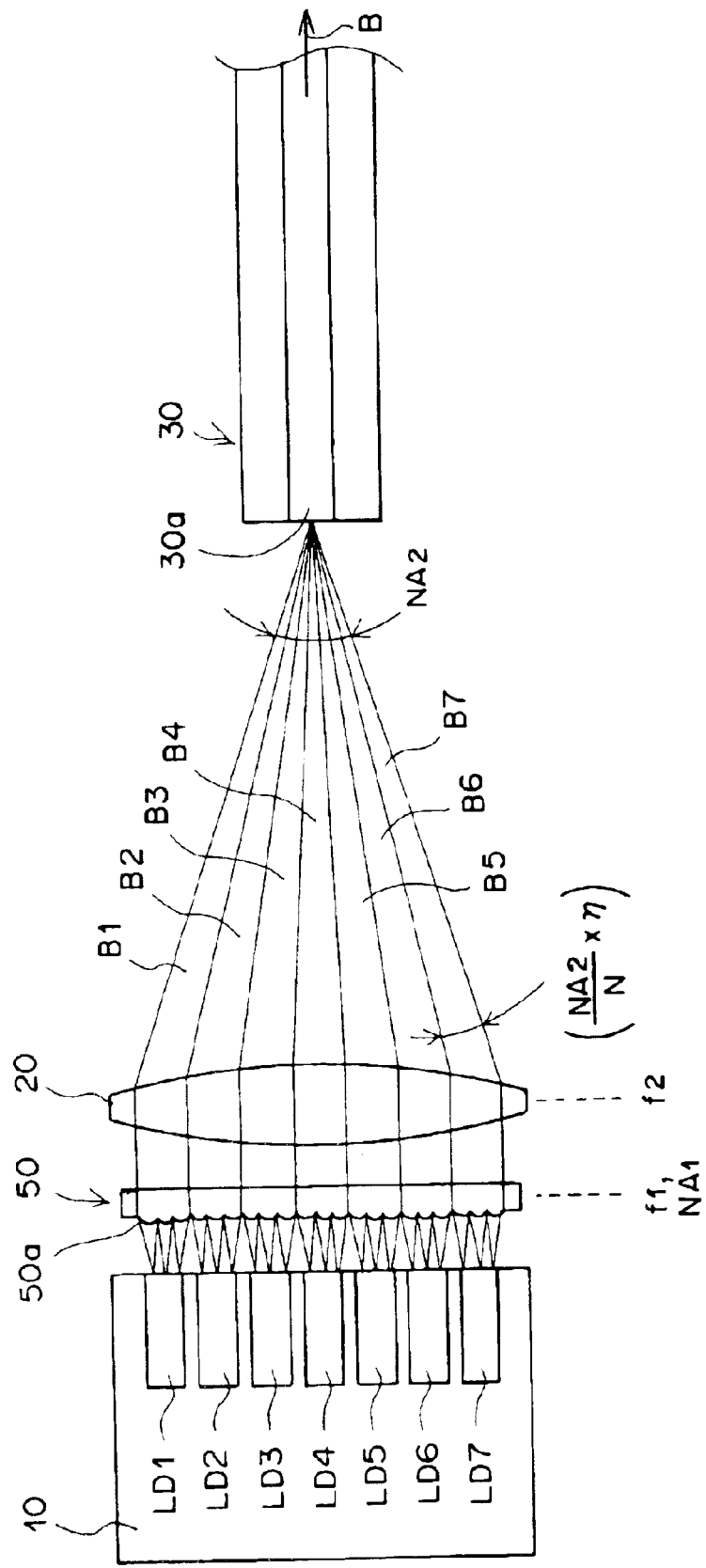
FIG. 23 is a plan view showing a wave-coupling laser source in accordance with a sixth embodiment of the present invention.

A wave-coupling laser source in accordance with a sixth embodiment of the present invention will be described with reference to FIG. 23, hereinbelow. In FIG. 23, elements analogous to those shown in FIG. 18 are given the same reference numerals and will not be described here unless necessary.

The wave-coupling laser source of this embodiment basically differs from that of the fifth embodiment in that a single collimator lens array 50 where collimator lens elements 50a for all the cavities of the laser diode chips LD1 to LD7 are integrated is employed in place of 7 collimator lens arrays 11 to 17.

Though the efficiency of utilization of space can be improved by closely arranging the 7 collimator lens arrays 11 to 17 of the structure described above and closely arranging the laser diode chips LD1 to LD7, the efficiency of utilization of space can be further improved by the use of the single collimator lens array 50. At the same time, when the efficiency of utilization of space is improved, positional precision required in assembly of the GaN-laser diode chips LD1 to LD7, the condenser optical system and the multimode optical fiber can be relatively loose, the reason for which will be described in detail, hereinbelow.

It is assumed that the focal length and the numerical aperture of each collimator lens elements 50a of the collimator lens array 50 are f1 and NA1, the focal length of the condenser lens 20 is f2, the numerical aperture of the multimode optical fiber 30 is NA2 and the efficiency of utilization of space is η as shown in FIG. 23. The efficiency of utilization of space η is defined by the proportion of the space occupied by the optical paths of the 7 laser beams B1 to B7 in the space between the laser beam B1 and the laser beam B7, and when the 7 laser beams are completely contiguous to each other as shown in FIG. 23, the efficiency of utilization of space η is 1.

Under the conditions described above, the magnification a of the lens system, i.e., the ratio of the beam spot diameter at each light emitting point of the laser diode chips LD1 to LD7 to the beam spot diameter at the light inlet end face of the core of the multimode optical fiber 30 is given by the following formula, wherein N represents the number of the laser beams to be coupled.

$$a = \frac{f_2}{f_1} = \frac{NA_1}{\left(\frac{NA_2}{N} \times \eta\right)} = \frac{NA_1}{NA_2} \times \frac{N}{\eta}$$

As can be seen from the formula above, as the efficiency of utilization of space η is increased, the magnification a of the lens system becomes smaller. As the magnification a of the lens system is smaller, the distance by which the laser beams B1 to B7 move on the end face of the core of the multimode optical fiber 30 when the laser diode chips LD1 to LD7, the condenser optical system and the multimode optical fiber 30 are shifted relatively to each other becomes smaller. Accordingly, even if positional precision required in assembly of the GaN-laser diode chips LD1 to LD7, the condenser optical system and the multimode optical fiber is relatively loose, the laser beams B1 to B7 can regularly impinge upon the core 30a of the multimode optical fiber 30. When positional precision required in assembly of the GaN-laser diode chips LD1 to LD7, the condenser optical system and the multimode optical fiber may be relatively loose, the number of laser beams to be coupled can be increased, whereby a higher output power laser source can be obtained. That is, by increasing the number of laser beams to be coupled, increase in magnification a of the lens system can be compensated for since as the efficiency of utilization of space η increases, the magnification a of the lens system becomes smaller.

Though, in the embodiments described above, 7 laser beams are coupled, the number of laser beams to be coupled need not be limited to 7 but may be any value not smaller than 2.

By stacking a plurality of support members such as a heat block each bearing thereon a plurality of laser diode chips fixed thereon in a row, a number of laser diode chips can be two-dimensionally arranged.

When a number of laser diode chips are two-dimensionally arranged as seen from the side which is irradiated by the laser beam, many laser diode chips can be arranged in a high density and it becomes feasible to emit a larger number of laser beams through one multimode optical fiber, whereby a wave-coupling laser beam of a higher output power can be obtained.

An image exposure device in accordance with a seventh embodiment of the present invention using the ultraviolet high-brightness wave-coupling fiber module shown in FIGS. 20 and 21 will be described with reference to FIGS. 24 to 28, hereinbelow.

Figure 24:
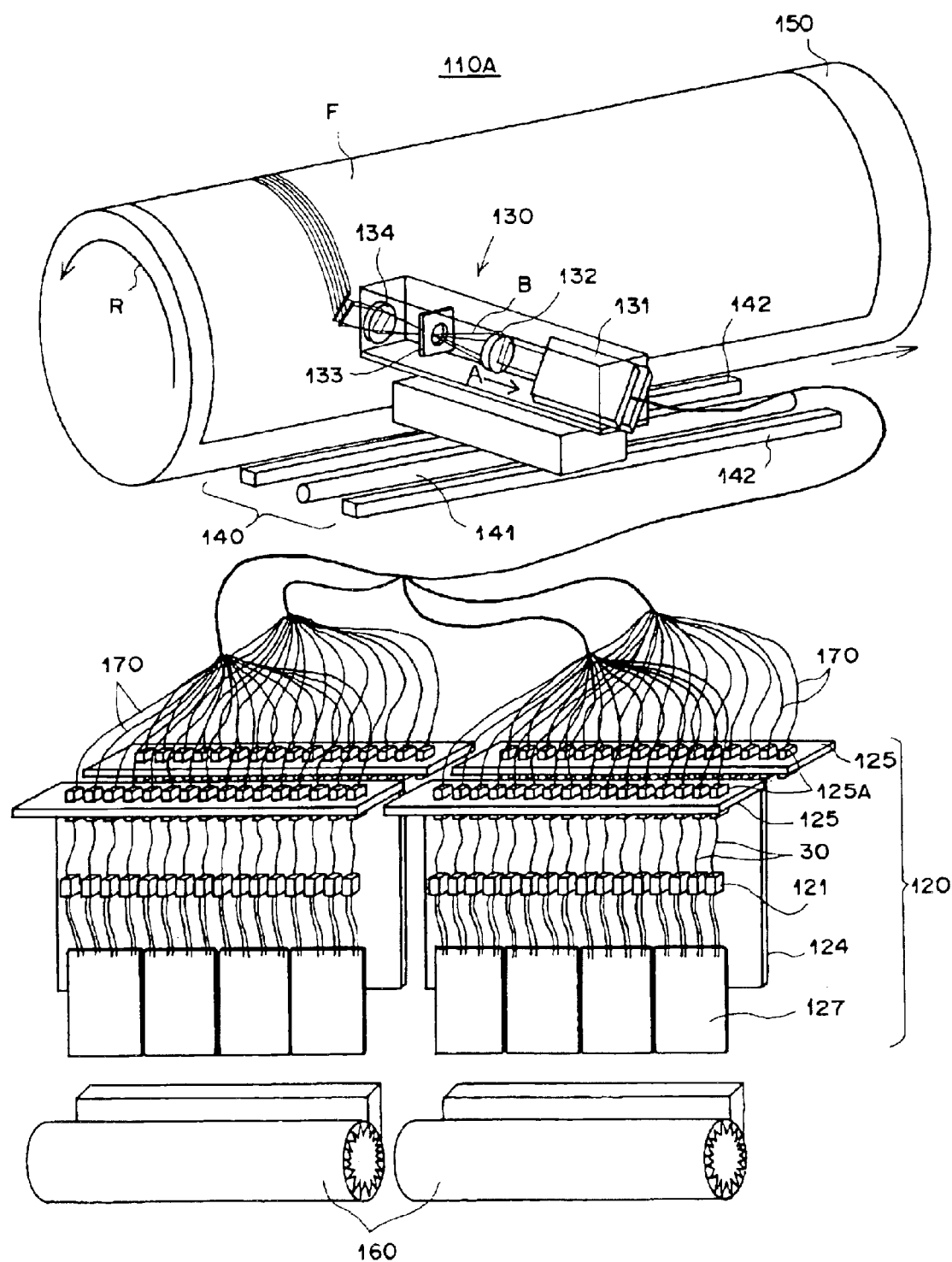
FIG. 24 is a perspective view showing an exposure device in accordance with a seventh embodiment of the present invention.

FIG. 24 shows an overall appearance of an image exposure device 110A of this embodiment. As shown in FIG. 24, the image exposure device 110A of this embodiment comprises a light source unit 120 which generates a plurality of laser beams, an exposure head 130 which condenses the laser beams generated by the light source unit 120, an exposure head moving mechanism 140 which moves the exposure head 130 in a sub-scanning direction, a drum 150 around which a recording medium F is wound and which is rotated in the direction of arrow R in FIG. 24 to move the recording medium F in a main scanning direction, and a pair of cooling blowers 160 which generate cooling air which is mainly for cooling the light source unit 120.

The recording medium F is a flexible recording medium which can be wound around the drum 150 such as a heat- or photo-sensitive film, or a heat- or photo-sensitive film printing plate material, and on which an image is recorded. Instead of winding around the drum 150 a recording medium F which is heat- or photo-sensitive, the drum 150 itself may be heat- or photo-sensitive.

The light source unit 120 comprises a pair of light source boards 124 on one side of which a plurality of ultraviolet high-brightness wave-coupling fiber modules 121 shown in FIGS. 20 and 21 are mounted and on the other side of which heat radiating fins 123 (FIG. 25) are provided, a pair of adaptor boards 125 which are erected along an end of the respective light source boards 124 and on which a plurality of (the same in number as the fiber modules 121) adaptors of SC type optical fiber connectors 125A are mounted, and a pair of LD driver boards 127 which are horizontally mounted on the other end of the respective light source boards 124 and on which an LD driver circuit 126 (FIG. 27) which drives the wave-coupling fiber modules 121 according to image data representing an image to be recorded on the recording medium F.

A plug of an SC type optical fiber connector 125A is connected to the end of the optical fiber 30 connected to each of the wave-coupling fiber modules 121 and is in engagement with one of the adaptors on the adaptor board 125. Accordingly, the laser beam emitted from each wave-coupling fiber module 121 is transmitted by the optical fiber 30 substantially to the middle of the adaptor on the adaptor board 125.

The output terminals from which signals for driving the wave-coupling fiber modules 121 emanate are discretely connected to the modules 121 so that the modules 121 can be separately controlled by the LD driver circuit 126.

The exposure head 130 is provided with a fiber array portion 131 through which laser beams B emitted from the respective modules 121 are emitted. Laser beams B emitted from the respective modules 121 are transmitted to the fiber array portion 131 by way of multimode optical fibers 170 by way of the optical connectors 125A.

Figure 26:
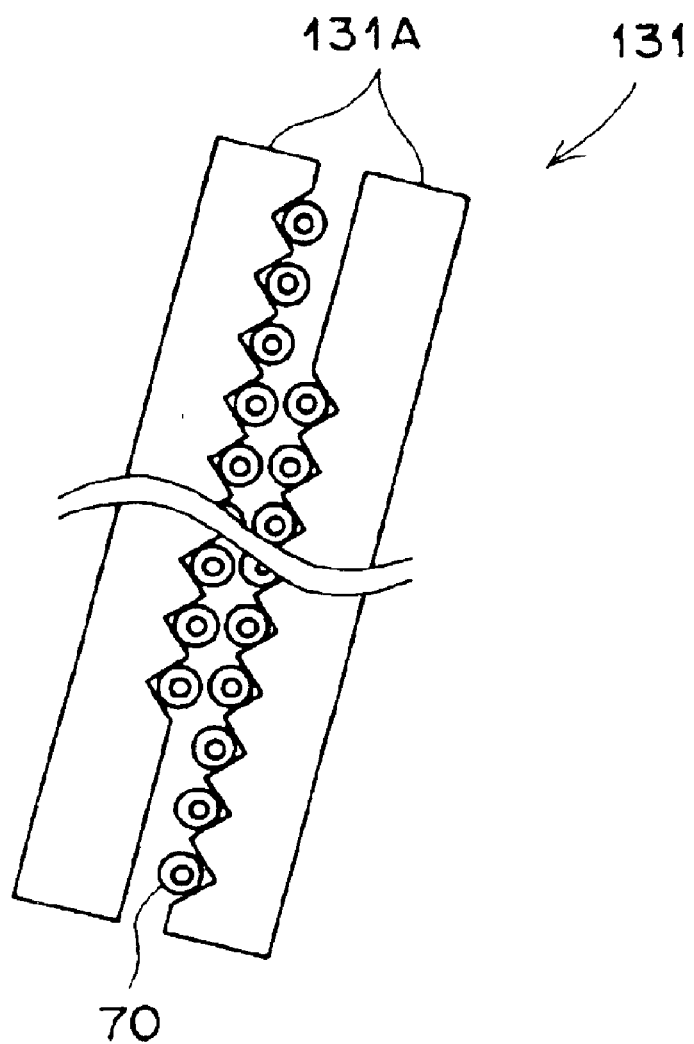
FIG. 26 is a fragmentary front view showing another part of the exposure device.

FIG. 26 shows the fiber array portion 131 as seen in the direction of arrow A in FIG. 24. As shown in FIG. 26, the fiber array portion 131 comprises a pair of boards 131A which are respectively provided on one side thereof with V-shaped grooves in a number equal to half of the number of the fiber modules 121 and are opposed to each other with the grooves opposed to each other. The end portion of one of the optical fibers 170 is received in each groove. Laser beams emitted from the respective fiber modules 121 are simultaneously emitted from the fiber array portion 131.

As shown in FIG. 24, the exposure head 130 is further provided with a collimator lens 132, an aperture member 133 and an imaging lens 134 between the fiber array portion 131 and the drum 150 in this order from the fiber array portion 131. The aperture member 133 is positioned so that its aperture is positioned in a far field position as seen from the laser beam exit end of the fiber array portion 131, whereby all the laser beams B emitted from the optical fibers 170 in the fiber array portion 131 are substantially uniformly throttled.

The exposure head moving mechanism 140 comprises a ball screw 141 extending in the sub-scanning direction and a pair of guide rails 142 which extend in parallel to the ball screw 141 on opposite sides thereof. When a sub-scanning motor 143 (FIG. 27) is energized and the ball screw 141 is rotated, the exposure head 130 in mesh with the ball screw 141 is moved in the sub-scanning direction under the guidance of the guide rails 142.

When a main scanning motor 151 (FIG. 27) is energized the drum 150 is rotated in the main scanning direction (the direction of arrow R).

Figure 25:
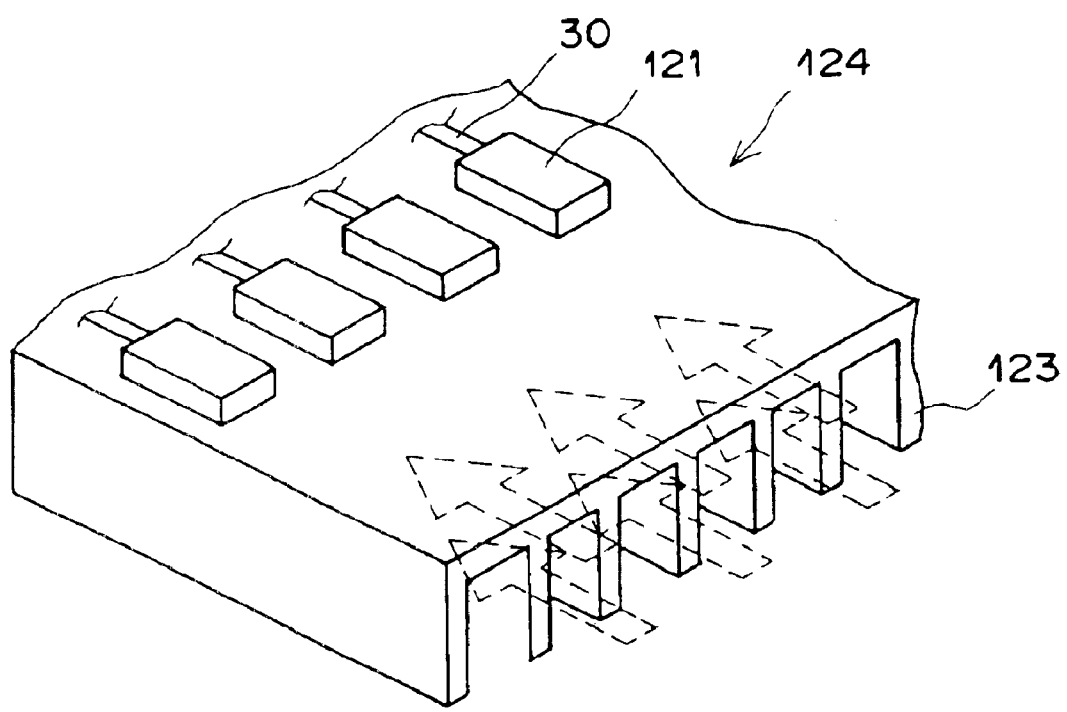
FIG. 25 is a fragmentary perspective view showing a part of the exposure device.

The cooling blowers 160 are positioned so that cooling air generated is blown on all the heat radiating fins 123 and the optical fibers 30 on the light source boards 124 as shown in FIGS. 24 and 25. The cooling air suppresses temperature increase of each fiber module and forces the optical fibers 30 to vibrate.

Figure 27:
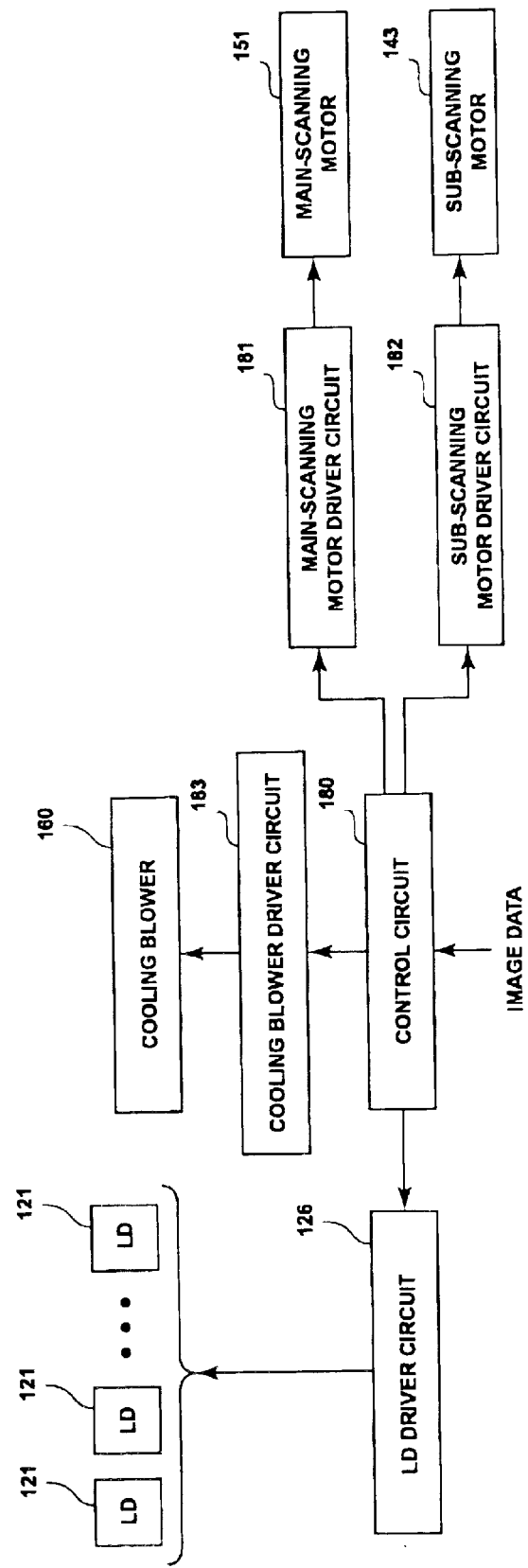
FIG. 27 is a block diagram showing the electric arrangement of the exposure device.

The control system of the image exposure device 110A of this embodiment will be described with reference to FIG. 27, hereinbelow. As shown in FIG. 27, the control system comprises the LD driver circuit 126 which drives the fiber modules 121 according to image data, a main scanning motor driver circuit 181 which drives the main scanning motor 151, a sub-scanning motor driver circuit 182 which drives the sub-scanning motor 143, a cooling blower driver circuit 183 which drives the cooling blower 160 and a control circuit 180 which controls the LD driver circuit 126, the main scanning motor driver circuit 181, the sub-scanning motor driver circuit 182 and the cooling blower driver circuit 183. Image data representing an image to be recorded on the recording medium F is supplied to the control circuit 180.

Figure 28:
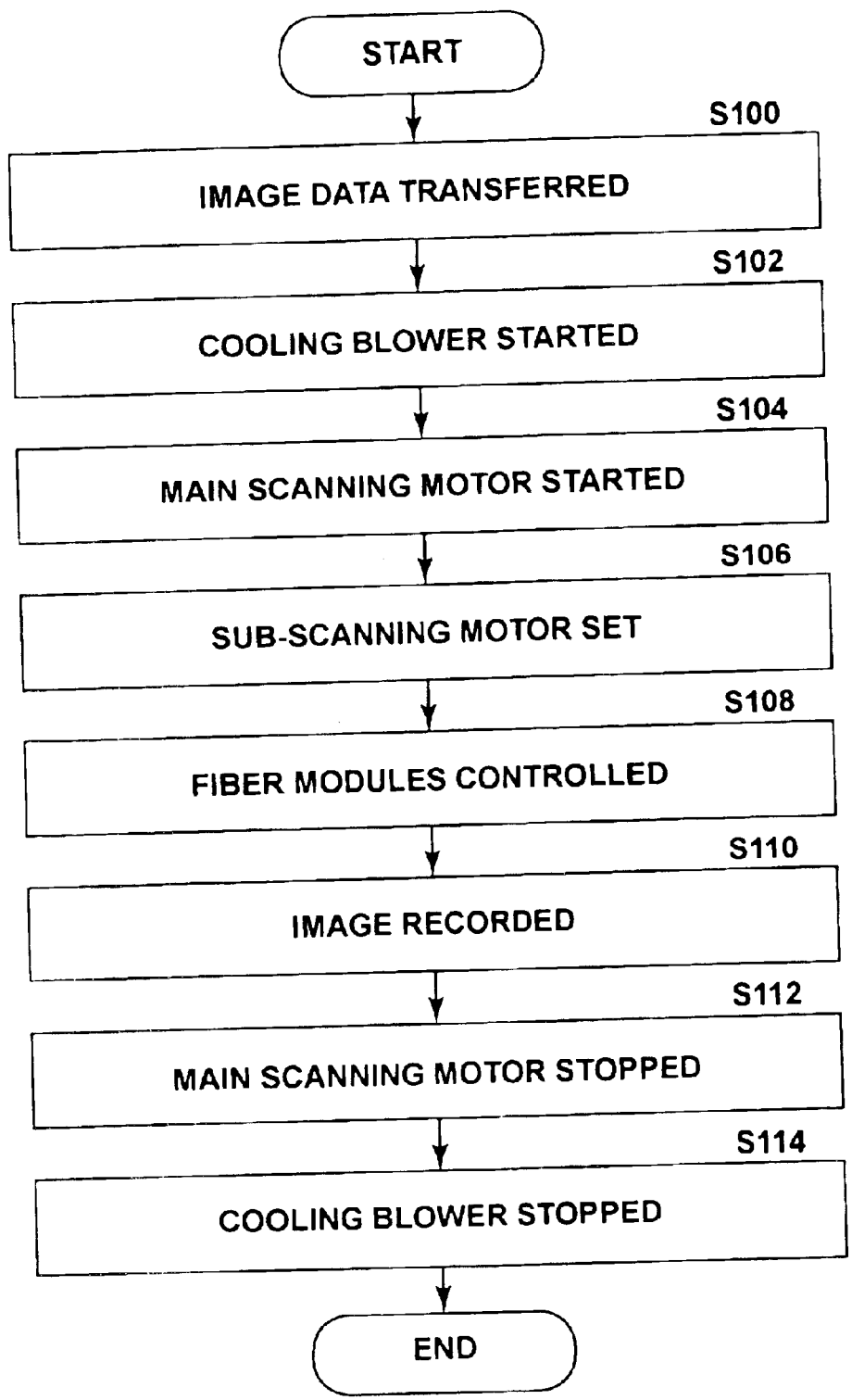
FIG. 28 is a flow chart for illustrating the operation of the exposure device.

The operation of the image exposure device 110A of this embodiment will be described with reference to the flow chart shown in FIG. 28, hereinbelow.

Image data representing an image to be recorded on the recording medium F is transferred to the control circuit 180 from an image memory (not shown) in which the image data has been temporarily stored. (step S100) The control circuit 180 supplies to the LD driver circuit 126, the main scanning motor driver circuit 181 and the sub-scanning motor driver circuit 182 a signal regulated on the basis of the image data transferred and resolution data representing a predetermined resolution.

Then the control circuit 180 causes the cooling blower driver circuit 183 to start the cooling blower 160. (step S102) When the cooling blower 160 is started, cooling of the fiber modules 121 is initiated and the optical fibers 30 begins to be vibrated.

When vibration of the optical fibers 30 is vibration such that it can randomize fluctuation in amount of light emitted from the optical fibers 30 within one main scanning time, unevenness in image recorded on the recording medium F can be suppressed. Accordingly, a compatible air flow which can produce such vibration of the optical fibers 30 and at the same time, is required to cool the heat radiating fins 123 is obtained in advance by experiments or computer simulations, and the cooling blower driver circuit 183 drives the cooling blower 160 so that the compatible air flow is produced.

Then the main scanning motor driver circuit 181 controls the main scanning motor 151 on the basis of the signal supplied from the control circuit 180 to rotate the drum 150 in the direction of arrow R in FIG. 24 at a speed according to the resolution data (step S104), and the sub-scanning motor driver circuit 182 sets the sub-scanning intervals at which the exposure head 130 is fed in the sub-scanning direction by the sub-scanning motor 143 according to the resolution data (step S106).

The LD driver circuit 126 controls the fiber modules 121 according to the image data. (step S108)

The laser beams B emitted from the respective fiber modules 121 are radiated from the fiber array portion 131 by way of the optical fibers 30, the SC type optical connectors 125A and the multimode optical fibers 170 and collimated by the collimator lens 132. Thereafter, the laser beams B are limited in its amount of light by the aperture member 133 and converged on the recording medium F on the drum 150 by the imaging lens 134.

Thus, the same number of beam spots as the number of the laser beams B radiated from the fiber modules 121 while the exposure head 130 is moved in the sub-scanning direction at the sub-scanning intervals set in step S106 and the drum 150 is rotated in the main scanning direction at a speed determined in step S104, whereby a two-dimensional image represented by the image data is recorded as a pattern of spots at the resolution represented by the resolution data (step S110).

Then the main scanning motor driver circuit stops the main scanning motor 151 (step S112) and the control circuit 180 stops the cooling blower 160 (step S114).

In this manner, a two-dimensional image is recorded on the recording medium F at a predetermined resolution. Since the cooling blower 160 is driven during recording, the optical fibers 30 are vibrated at random and a noise like a white noise is superimposed on the laser beams propagating through the optical fibers 30. As a result, the two-dimensional image can be free from unevenness like swath or beat.

Figure 29:
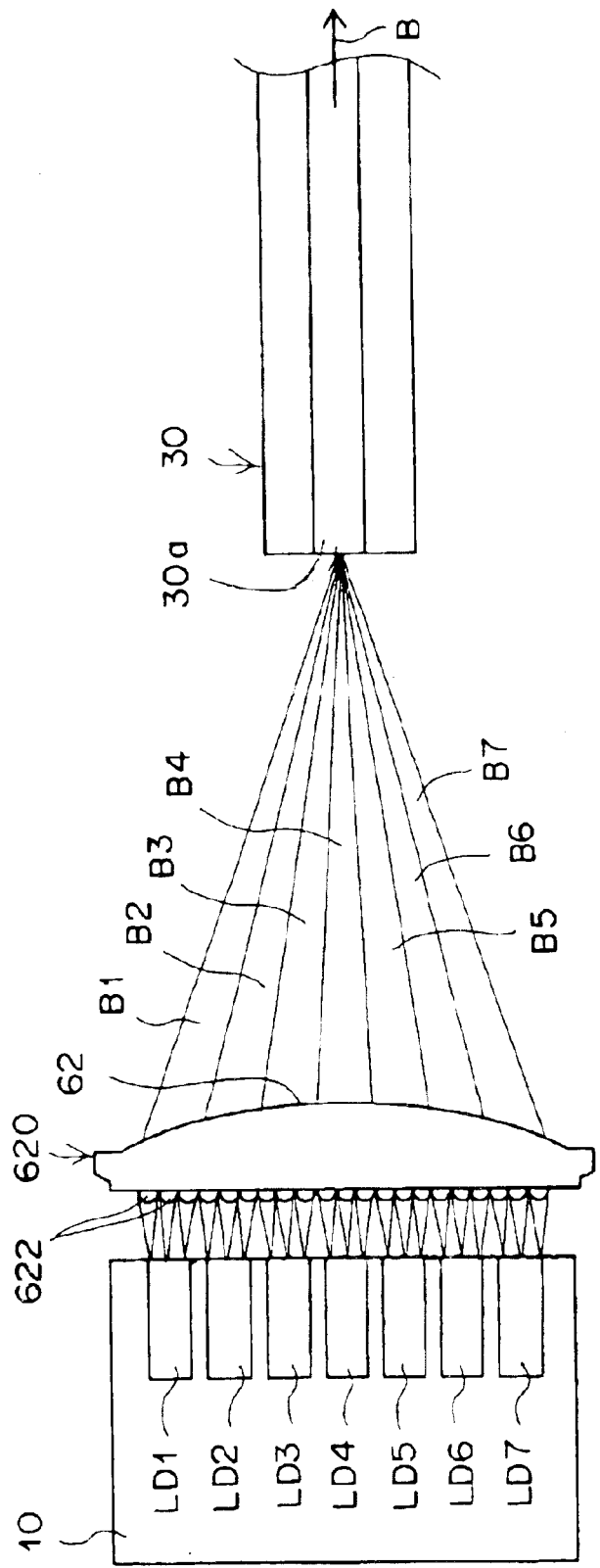
FIG. 29 is a plan view showing a wave-coupling laser source in accordance with an eighth embodiment of the present invention.

A wave-coupling laser source in accordance with an eighth embodiment of the present invention will be described with reference to FIG. 29, hereinbelow. The wave-coupling laser source of this embodiment differs from that shown in FIG. 18 in that a single condenser lens 620 is employed in place of the 7 collimator lens arrays 11 to 17 and a condenser lens 20. The condenser lens 620 comprises a plurality of collimator lens portions 622 arranged in a row like an array and a single condenser lens portion 624 integrated with each other. Such a condenser lens can be suitably formed of synthetic resin or glass.

By employing such a condenser lens 620, positional precision required in assembly of the optical system may be relatively loose and the number of laser beams to be coupled can be increased, whereby a higher output power laser source can be obtained. Further, adjustment of the collimator lens can be simplified.

Figure 30:
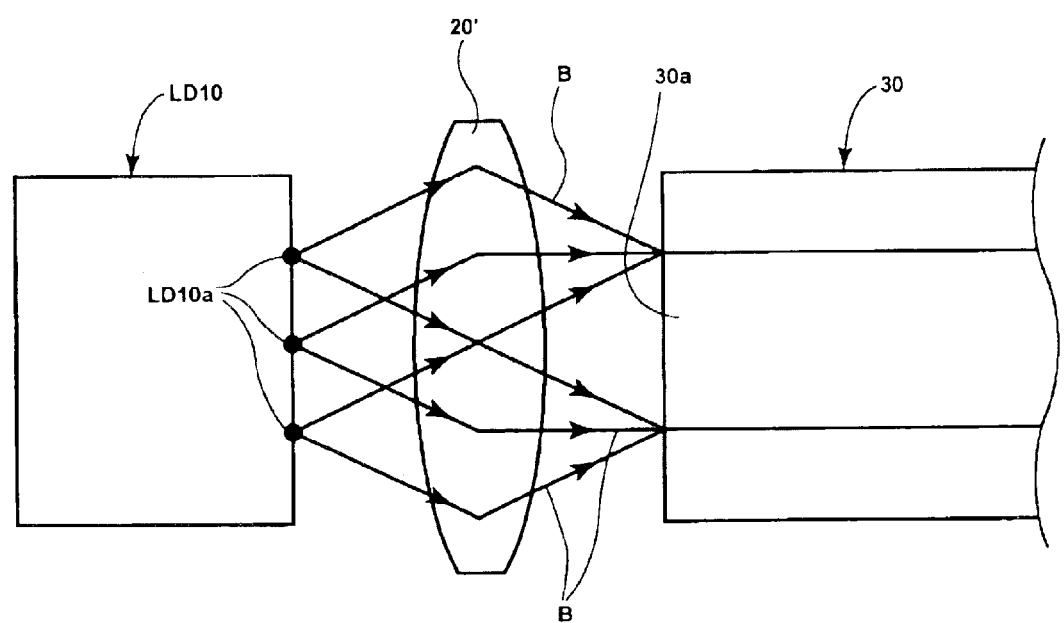
FIG. 30 is a plan view showing a wave-coupling laser source in accordance with a ninth embodiment of the present invention.

A wave-coupling laser in accordance with a ninth embodiment of the present invention will be described with reference to FIG. 30, hereinbelow. FIG. 30 is a fragmentary plan view showing a part of the wave-coupling laser source in accordance with the ninth embodiment of the present invention. The wave-coupling laser source of this embodiment differs from that shown in FIG. 18 in that only one multi-cavity laser diode chip LD10 having a plurality of (three in this particular embodiment) light emitting points LD10a is employed and laser beams emitted from the respective light emitting points are introduced into the core 30a of the multimode optical fiber 30 by a lens 20'.

In this particular embodiment, the multi-cavity laser diode chip LD10 is a GaN-laser diode oscillating at 405 nm. The light emitting points LD10a of the multi-cavity laser diode chip LD10 are distributed in a width substantially equal to the diameter (25 μm) of the core 30a of the multimode optical fiber 30. The laser beams B emitted from the respective light emitting points LD10a are led to the light inlet end face of the core 30a and propagates through the core 30a to be radiated from the optical fiber 30 coupled into one laser beam.

In the wave-coupling laser source of this embodiment. since the light emitting points LD10a of the multi-cavity laser diode chip LD10 are distributed in a width substantially equal to the diameter of the core 30a of the multimode optical fiber 30, the laser beams B emitted from the respective light emitting points LD10a can be well led to the core 30a of the multimode optical fiber 30 by the lens 20'. The lens 20' may comprise, for instance, a convex lens which is substantially equal in its focal length to the diameter of the core 30a of the optical fiber 30 or a rod lens which collimates the laser beams only in a plane perpendicular to the active layer of the laser diode chip LD10. That is, in accordance with this embodiment, a high efficient wave coupling can be realized by an optical system of a simple structure. Further, in the laser source of this embodiment, thermal interference between the light emitting points LD10a does not occur and heat dissipation is facilitated, which makes the system stable and/or makes it easy to obtain high output power. For example, by the use of a multi-cavity laser diode chip each of the light emitting points of which is 100 mW in output power, it is possible to make a wave-coupling laser source whose output power is about 300 mW.

What is claimed is:

1. A laser diode array comprising:
    a plurality of multi-cavity laser diode chips, each having a plurality of light emitting points fixed side by side;
    a plurality of collimator lenses; and
    a condenser lens,
    wherein the multi-cavity laser diode chips are arranged in a first direction which is the direction in which the light emitting points in each of the multi-cavity laser diode chips are arranged, a respective one of the plurality of collimator lenses is provided for each of the laser diode chips and is smaller in diameter of aperture in the first direction than in a second direction perendicular to the first direction, and the condenser lens condenses a plurality of laser beams, each of the laser beams collimated by the respective collimator lenses, and converges the laser beams on an end face of an optical fiber.

2. A laser diode array as defined in claim 1 in which the number of cavities in each of the multi-cavity laser diode chips is 2 to 10.

3. A laser diode array as defined in claim 2 in which the number of cavities in each of the multi-cavity laser diode chips is 2 to 6.

4. A laser diode array as defined in claim 1 in which each of the multi-cavity laser diode chips is not larger than 3 mm in its width and the multi-cavity laser diode chips are fixed on a fixing block in a junction-down structure with fluctuation in height of the light emitting position held not larger than 5 μm.

5. A laser diode array as defined in claim 4 in which each of the multi-cavity laser diode chips is not larger than 0.5 mm in its width and the multi-cavity laser diode chips are fixed on a fixing block in a junction-down structure with fluctuation in height of the light emitting position held not larger than 2.5 μm.

6. A laser diode array as defined in claim 1, wherein the multi-cavity laser diode chips are fixed side by side on a block.

7. A laser diode array as defined in claim 6 in which
    the multi-cavity laser diode chip is a nitride-series semiconductor,
    the multi-cavity laser diode chips are mounted on a heat radiating block of Cu or Cu-alloy by way of a sub-mount,
    the sub-mount is formed of a material whose coefficient of thermal expansion is $3.5{\sim}6.0\times10^{-6}/°$ C. and is 200 to 400 μm thick, and
    the multi-cavity laser diode chips are bonded to the sub-mount in a junction-down structure by way of an AuSn-eutectic solder layer and a metallized layer which are divided into a plurality of portions in the bonding plane between the multi-cavity laser diode chip and the sub-mount.

8. A laser diode array as defined in claim 7, further comprising a groove dividing the AuSn-eutectic solder layer and the metallized layer just below the light emitting portion.

9. A laser diode array as defined in claim 8 in which the multi-cavity laser diode chip is a GaN-series laser diode chip and the sub-mount is of AlN.

10. A laser diode array as defined in claim 8 in which the sub-mount is bonded to the heat radiating block of Cu or Cu-alloy by AuSn-eutectic solder.

11. A laser device comprising:
    a plurality of multi-cavity laser diode chips, each having a plurality of light emitting points, fixed side by side;

a block on which the multi-cavity laser diode chips of a laser diode array are fixed; and a collimator lens array consisting of a plurality of collimator lens elements integrated with each other and arranged in one direction, each of the collimator lens elements adapted to convert a laser beam emitted from the corresponding one of the plurality of light emitting points of the multi-cavity laser diode chips to a parallel light beam, wherein:

a flat lens locator surface, which is perpendicular to the axes of light emission of the multi-cavity laser diode chips, is formed on the block at a predetermined distance from the light emitting points of the multi-cavity laser diode chips forward of the multi-cavity laser diode chips fixed to the block, and the collimator lens array is fixed to the block with an end face of the collimator lens array in abutment against the lens locator surface.

12. A laser device as defined in claim 11 in which the lens locator surface is not larger than 0.5 $\mu$m in flatness.

13. A laser device as defined in claim 11 in which the surface of the block on which the multi-cavity laser diode chips are fixed is not larger than 0.5 $\mu$m in flatness.

14. A laser device as defined in claim 11 in which the multi-cavity laser diode chips are arranged in a plurality of rows arranged in a direction intersecting the direction in which the light emitting points in each multi-cavity laser diode chip are arranged with the light emitting points in the multi-cavity laser diode chips in each row being arranged in one direction, and a plurality of collimator lens arrays are arranged in a direction intersecting the direction in which the collimator lens elements in each collimator lens array are arranged.

15. A laser device as defined in claim 14, wherein the direction in which the plurality of rows are arranged is perpendicular to the direction in which the light emitting points in each multi-cavity laser diode chip are arranged.

16. A laser device as defined in claim 14, wherein each row of said plurality of rows includes a plurality of multi-cavity laser diode chips arranged in a first direction, and the rows are arranged in a second direction perpendicular to the first direction, the multi-cavity laser diode chips being in a row-and-column arrangement in a plane containing both the first direction and the second direction.

17. A laser device as defined in claim 11, wherein the multi-cavity laser diode chips are arranged in the direction in which the light emitting points in each of the multi-cavity laser diode chips are arranged.

18. A laser device as defined in claim 17, wherein each collimator lens element is shaped like an elongated section of a lens obtained by cutting a part including the optical axis from a lens symmetrical about its optical axis.

19. A wave-coupling laser source comprising:

a laser diode array including a plurality of multi-cavity laser diode chips fixed side by side, each multi-cavity diode chip having a plurality of light emitting points;

a multimode optical fiber; and a condenser optical system which condenses a plurality of laser beams emitted from the laser diode array and couples together the laser beams in the multimode optical fiber;

wherein the multi-cavity laser diode chips are arranged in a first direction which is the direction in which the light emitting points in each of the multi-cavity laser diode chips are arranged, the condenser optical system comprises a plurality of collimator lenses and a condenser lens, a respective collimator lens of said plurality of collimator lenses is provided for each of the laser diode chins and is smaller in diameter of aperture in the first direction than in a second direction perpendicular to the first direction, and the condenser lens condenses a plurality of laser beams, each of the laser beams collimated by the respective collimator lenses, and converges the laser beams on an end face of the multimode optical fiber.

20. A wave-coupling laser source as defined in claim 19 in which the collimator lenses are integrated into a lens array.

21. A wave-coupling laser source as defined in claim 19 in which the condenser optical system comprises a plurality of collimator lens portions each collimating a plurality of laser beams emitted from the laser diode array and a condenser lens portion which converges the laser beams collimated by the collimator lens portions on a point and is integrated with the collimator lens portions.

22. wave-coupling laser source as defined in claim 19 in which the multi-cavity laser diode chip is a GaN-laser diode chip.

23. A wave-coupling laser source as defined in claim 19 in which the plurality of multi-cavity laser diode chips are two-dimensionally arranged as seen from the side which is irradiated by the laser beam, thereby forming a plane of the light emitting points.

24. A wave-coupling laser source as defined in claim 19 in which a plurality of the multimode optical fibers are arranged to form a one-dimensional array at least at their light exit ends, and said laser diode array and the condenser optical system are combined with each of the multimode optical fibers.

25. An exposure device having a wave-coupling laser source as defined in claim 24 as a light source for exposure.

26. A wave-coupling laser source as defined in claim 19 in which a plurality of the multimode optical fibers are arranged into a bundle at least at their light exit ends, and said laser diode array and the condenser optical system are combined with each of the multimocle optical fibers.

27. An exposure device having a wave-coupling laser source as defined in claim 26 as a light source for exposure.

28. A laser device as defined in claim 19, wherein an active layer of each laser diode chip is parallel to said first direction.

29. A wave-coupling laser source comprising:

a multimode optical fiber;

a laser diode array including a plurality of multi-cavity laser diode chips fixed side by side, each multi-cavity laser diode chip having a plurality of light emitting points, the plurality of light emitting points arranged in a width substantially equal to the diameter of the core of the multimode optical fiber; and an optical system which couples laser beams emitted from the respective light emitting points of the multi-cavity laser diode chip together in the multimode optical fiber;

wherein the multi-cavity laser diode chips are arranged in a first direction which is the direction in which the light emitting points in each of the multi-cavity laser diode chips are arranged, the optical system comprises a plurality of collimator lenses and a condenser lens, a respective collimator lens of said plurality of collimator lenses is provided for each of the laser diode chips and is smaller in diameter of aperture in the first direction than in a second direction perpendicular to the first direction, and the condenser lens condenses a plurality of laser beams, each of the laser beams collimated by the respective collimator lenses, and converges the laser beams on an end face of the multimode optical fiber.

30. A wave-coupling laser source as defined in claim 29 in which the multi-cavity laser diode chip is a GaN-laser diode chip.

31. A wave-coupling laser source as defined in claim 29 in which a plurality of said multimode optical fibers are arranged to form a one-dimensional array at least at their light exit ends, and said laser diode chip and the optical system are combined with each of the multimode optical fibers.

32. An exposure device having a wave-coupling laser source as defined in claim 31 as a light source for exposure.

33. A wave-coupling laser source as defined in claim 29 in which a plurality of said multimode optical fibers are arranged into a bundle at least at their light exit ends, and said laser diode array and the optical system are combined with each of the multimode optical fibers.

34. An exposure device having a wave-coupling laser source as defined in claim 33 as a light source for exposure.

35. The wave-coupling laser source of claim 29, wherein three or more light emitting points are arranged in a width of less than or equal to 25 $\mu$m.

* * * * *